(12) United States Patent
Meguro et al.

(10) Patent No.: US 7,157,311 B2
(45) Date of Patent: Jan. 2, 2007

(54) SUBSTRATE SHEET MATERIAL FOR A SEMICONDUCTOR DEVICE AND A MANUFACTURING METHOD THEREOF, A MOLDING METHOD USING A SUBSTRATE SHEET MATERIAL, A MANUFACTURING METHOD OF SEMICONDUCTOR DEVICES

(75) Inventors: Kouichi Meguro, Kawasaki (JP); Toru Nishino, Kawasaki (JP); Noboru Hayasaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 10/718,677

(22) Filed: Nov. 24, 2003

(65) Prior Publication Data

US 2004/0099943 A1   May 27, 2004

(30) Foreign Application Priority Data

Nov. 26, 2002   (JP)   ............................. 2002-342964

(51) Int. Cl.
*H01L 21/50* (2006.01)

(52) U.S. Cl. ..................... 438/110; 438/112; 438/113; 438/127; 438/460

(58) Field of Classification Search ................ 438/108, 438/110, 112, 113, 127, 460
See application file for complete search history.

(56) References Cited

U.S. PATENT DOCUMENTS

| 6,537,482 B1 * | 3/2003 | Farnworth ................... 264/482 |
| 6,676,885 B1 * | 1/2004 | Shimizu et al. ............. 264/511 |
| 6,965,160 B1 * | 11/2005 | Cobbley et al. ............ 257/686 |

FOREIGN PATENT DOCUMENTS

| JP | 10-79362 | 3/1998 |
| JP | 2000-12745 | 1/2000 |
| JP | 2002-110718 | 4/2002 |

* cited by examiner

Primary Examiner—M. Wilczewski
Assistant Examiner—Toniae M. Thomas
(74) Attorney, Agent, or Firm—Westerman, Hattori, Daniels & Adrain, LLP.

(57) ABSTRACT

A substrate sheet material for semiconductor device and manufacturing method thereof and a manufacturing method of a semiconductor device using the substrate sheet material can suppress and reduce a warp which may occur in the substrate sheet material even when a plurality of semiconductor chips formed in the substrate sheet material are molded all at once. A plurality of substrates to be used for producing semiconductor packages are formed in the substrate sheet material. An outer configuration of the substrate sheet material is made into a circular shape.

15 Claims, 29 Drawing Sheets

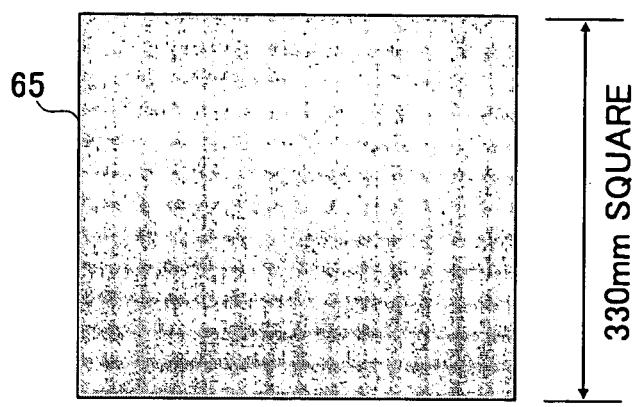
FIG.30A
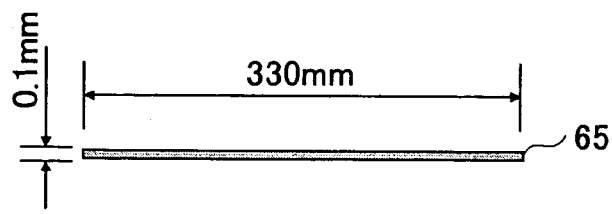
FIG.30B
FIG.31
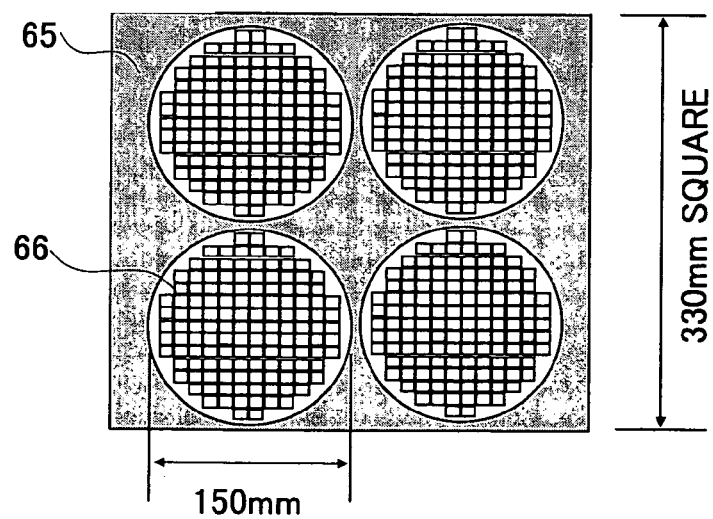

SUBSTRATE SHEET MATERIAL FOR A SEMICONDUCTOR DEVICE AND A MANUFACTURING METHOD THEREOF, A MOLDING METHOD USING A SUBSTRATE SHEET MATERIAL, A MANUFACTURING METHOD OF SEMICONDUCTOR DEVICES

BACKGROUND OF THE INVENTION

1. Field of the Invention

The present invention relates to a substrate sheet material for a semiconductor device and manufacturing method thereof and a manufacturing method of a semiconductor device using the substrate sheet material and, more particularly, to a technique effective to formation of a semiconductor device referred to as a ball grid array (BGA) or a land grid array (LGA).

2. Description of the Related Art

With miniaturization and speeding-up of electronic equipments, further miniaturization and higher densification are required for semiconductor devices applied to the electronic equipments.

In order to satisfy such requirements, semiconductor devices such as a ball grid array (BGA) or a land grid array (LGA) are used. Such a semiconductor device of a BGA type or a LGA type uses a substrate (a tape substrate or a printed board) that is made of polyimede or glass-epoxy. The substrate has a wiring layer on a surface thereof or inside thereof, and electrodes are formed on the surface. A semiconductor chip (semiconductor element) is mounted on the substrate, and electrodes of the semiconductor chip are electrically connected to the wiring/electrodes of the substrate. The semiconductor chip is encapsulated by a resin or other cap materials. Ball-like terminals or land-like terminals for external connection are provided on the electrodes. Japanese Laid-Open Patent Application No. 2000-12745 discloses a semiconductor device having the above-mentioned structure.

There is a demand for cost reduction with respect to the semiconductor devices of a BGA type or a LGA type. As one of measures for satisfying such a demand, it has been attempted to increase efficiency of the manufacturing method of the semiconductor devices after formation of the substrate.

That is, the above-mentioned substrate uses a polyimide sheet or a glass-epoxy sheet as a base material (blank material), the base material having a electrically conductive layer such as a copper (Cu) layer formed on at least one of main surfaces thereof so that the substrate is constituted as a resin substrate having a single layer structure or, if needed, a multi-layer structure in which wiring layers are provided between layers according to a semiconductor element mounted thereon.

At this time, the substrate (blank material) is prepared as a sheet-like material having a large area so as to form a substrate sheet material in which many substrates are formed, thereby, increasing a number of substrates, that is, a number of semiconductor chips mounted thereon so as to increase a number of semiconductor devices formed in a single process.

The plurality of substrates formed in the substrate sheet material are separated with the resin material which covers the semiconductor chips mounted on the substrates concerned after the above-mentioned terminals for external connection are arranged.

FIG. 1 shows a conventional manufacturing process from production of the substrates to production of the semiconductor devices.

First, a blank material 1, which is made of a resin sheet and turned into a material of substrates, is prepared. The blank material 1 has an area required for forming a desired plurality of substrates collectively.

Next, wiring corresponding to the plurality of substrates are performed on the blank material 1. In the example shown in FIG. 1, three substrate sheet materials 2 are formed from the blank material, and wirings corresponding to the plurality of substrate 3 are formed in each of the substrate sheet materials 2.

In the wiring process, a well-known technique in this field is used. That is, through holes are formed in the blank material 1, and copper (Cu) plating is applied to both sides of the blank material 1. If the blank material 1 has an electrically conductive layer such as copper (Cu) previously formed on a resin substrate, the electrically conductive material is used. Then, a resist is provided on the copper plating so as to perform photoetching to form the cupper plating into a predetermined pattern. Thereafter, nickel and gold plating is applied onto the copper plating, and the wiring process is completed.

After completion of the wiring process, the blank material 1 is cut and separated into the substrate sheet materials 2. Each of the substrate sheet materials 2 is in the form of a strip sheet in which a plurality of substrates are formed consecutively so as to facilitate handling in a subsequent process of manufacturing semiconductor devices. The strip-like substrate sheet materials 2 are supplied to an assembling process of semiconductor devices.

The substrates are formed by being arranged in two rows in the substrate sheet material 2 shown in FIG. 1.

In the semiconductor assembling process, semiconductor chips are mounted to all the substrates 3 formed in the single substrate sheet material 2, and the semiconductor chips are collectively resin-molded and finally individualized so as to efficiently form semiconductor devices.

If a substrate sheet material having a large area is resin-molded at one time, a warp may be generated in the substrate sheet material since a thermal expansion rates are different between the substrate sheet material 2 and the mold resin. In order to prevent generation of such a warp, there is a case in which a plurality of concaves (grooves) are provided on the surface of the resin mold. Such a structure is disclosed, for example, in Japanese Laid-Open Patent Application No. 2002-110718.

However, according to this approach, a mechanical strength is reduced since the grooves of the concaves must be made considerably deep, and destruction may occur during processes after the resin molding and after being separated into individual semiconductor devices. Moreover, there also is a problem in that it is difficult to provide a stamp on a surface of the molded resin.

As mentioned above, when forming semiconductor devices by forming a plurality of substrates in a single substrate sheet material and mounting a semiconductor chip on each portion corresponding to a substrate and thereafter resin-molding the semiconductor chips collectively, the semiconductor devices can be formed more efficiently by forming many more substrates 3 in a single substrate sheet material 2, which results in reduction in the manufacturing cost of each individual semiconductor device.

Then, when the substrates 3 are consecutively formed in the substrate sheet material 2 as shown in FIG. 2A, after a semiconductor chips 4 are mounted to all the substrates of the substrate sheet material 2 as shown in FIG. 2C, the plurality of semiconductor chips 4 are collectively resin-molded as shown in FIGS. 3A and 3B, which results in a resin seal part 5 having a large area formed on the substrate sheet material 2. It should be noted that each of the substrates 3 formed in the substrate sheet material 2 has a semiconductor chip mounting portion 3a in the center portion thereof, as shown in FIG. 2B, and substrate side electrodes 3b, to which lead wires extending from electrodes of the semiconductor chips 4 are connected, are arranged in the vicinity of the circumference.

When the semiconductor chips 4 are of a flip-chip type, the substrate side electrodes are arranged corresponding to the electrodes of the semiconductor chips 4.

However, since a thermal expansion rate of the substrate sheet material 2 is different from that of a mold resin, a warp may occur in the substrate sheet material 2 after molding as shown in FIG. 4. Although it is effective to use a mold resin having a high glass transition temperature Tg in order to control generation of such a warp, the mold resin having a high glass transition temperature Tg is generally poor in a heat resistance, and, thus, a warp and a heat resistance are in a relationship of trade-off. Therefore, if an attempt is made to solve the problem of warping by the mold resin alone, there may be raised another problem that the reliability of a semiconductor device is decreased.

Such a warp of the substrate sheet material 2 is more remarkable as an area to be covered by molding is increased or the number of substrates to be molded is increased. Moreover, if a strip or rectangular material is used for the substrate sheet material, a degree of a warp increases in a direction along a longer side thereof.

Thus, in the present condition, the substrates 3 formed in the substrate sheet material 2 is divided into several groups as shown in FIG. 5, and molding is performed on an individual group basis as shown in FIGS. 6A and 6B. In the example shown in FIGS. 6A and 6B, the substrates 3 are divided into groups each including four pieces and resin molding is performed on each four substrates at one time so as to form a plurality of seal resin parts 6 each having an area smaller than that of the seal resin part shown in FIG. 3.

Thus, although a warp of the substrate sheet material 2 is suppressed by molding the substrates 3 by dividing them into groups, a number of substrates 3 formable in a single substrate sheet material 2 is decreased. This problem also occurs when increasing the number of substrates by increasing a size of the substrate sheet material 2, and is a bottle-neck for a more efficient manufacture of semiconductor devices.

SUMMARY OF THE INVENTION

It is a general object of the present invention to provide an improved and useful substrate sheet material for semiconductor devices and manufacturing method thereof in which the above-mentioned problems are eliminated.

A more specific object of the present invention is to provide a substrate sheet material for semiconductor device and manufacturing method thereof and a manufacturing method of a semiconductor device using the substrate sheet material which can suppress and reduce a warp which may occur in the substrate sheet material even when a plurality of semiconductor chips formed in the substrate sheet material are molded all at once.

In order to achieve the above-mentioned objects, there is provided according to one aspect of the present invention a substrate sheet material in which a plurality of substrates to be used for producing semiconductor packages are formed, wherein an outer configuration of the substrate sheet material is made into a circular shape.

The substrate sheet material according to the present invention, a through opening may be provided at a center of the substrate sheet material. Additionally, at least one through hole may be provided in an area other than an area where the substrates are formed. Further, a plurality of the through holes may be provided and arranged along a circumference of the area where the substrates are formed.

Additionally, there is provided according to another aspect of the present invention a substrate sheet material in which a plurality of substrates to be used for producing semiconductor packages are formed, wherein at least one through hole is provided outside an area where the substrates are formed and within an area where a resin mold is formed. In the above-mentioned substrate sheet, a plurality of the through holes may be provided and arranged along a circumference of the area where the substrates are formed.

Additionally, there is provided according to another aspect of the present invention a mold method of a substrate sheet material, comprising: preparing a circular substrate sheet material in which a plurality of substrates are formed; mounting a semiconductor chip onto each of the substrates; and resin-molding the semiconductor chips all at once.

In the mold method according to the present invention, wherein an opening is formed at a center of the circular substrate sheet, and a mold resin is filled into a cavity of a mold die through the opening. The mold method according to the present invention may further comprising; forming at least one through hole outside an area where the substrate are formed and within an area where a resin mold is formed; and supplying a mold resin to a backside of the substrate sheet material opposite to a front side where the semiconductor chips are mounted so as to form a resin part on the backside. Additionally, the mold method may comprise: forming a plurality of the through holes along a circumference of a resin part formed on the surface of the substrate sheet material; supplying the mold resin to the backside through the plurality of through holes; and forming on the backside a resin part having a shape along the resin part formed on the front side.

Additionally, according to another aspect of the present invention a mold method of a substrate sheet material comprising: preparing a substrate sheet material in which a plurality of substrates are formed, the substrate sheet material having at least one through hole outside an area where the substrates are formed and within an area where a resin mold is formed; mounting a semiconductor chip onto each of the substrate of the substrate sheet material; molding the mounted semiconductor chips all at once; and introducing a mold resin through the through hole into a backside of the substrate sheet material opposite to a front side on which the semiconductor chips are mounted so as to form a resin part on the backside.

The above-mentioned mold method may comprise: forming a plurality of the through holes along a circumference of the resin part formed on the front side of the substrate sheet material; supplying the mold resin to the backside through the plurality of through holes; and forming on the backside of the substrate sheet material a resin part having a shape along the resin part formed on the front side of the substrate sheet material.

Additionally, there is provided according to another aspect of the present invention a manufacturing method of a substrate sheet material for manufacturing substrates all at once, the substrates used for manufacturing semiconductor packages, the method comprising: preparing a sheet material having a circular outer configuration; and forming a circular substrate sheet material by forming wiring on the sheet material and forming a plurality of substrates in the sheet material.

Further, there is provided according to another aspect of the present invention a manufacturing method of a substrate sheet material for manufacturing substrates all at once, the substrates used for manufacturing semiconductor packages, the method comprising: preparing a sheet material having a quadrate outer configuration; forming wiring on the sheet material and forming a plurality of substrates in the sheet material; and forming a circular substrate sheet material by cutting the sheet material having the plurality of substrates in a circular shape.

Additionally, there is provided according another aspect of the present invention a manufacturing method of semiconductor devices, comprising: preparing a circular substrate sheet material in which a plurality of substrates are formed, the substrates used for producing semiconductor packages; mounting a semiconductor chips onto each of the substrates of the circular substrate sheet material; molding the semiconductor chips on the substrate sheet material all at once so as to form the semiconductor packages corresponding to the respective substrates; and individualizing the semiconductor packages.

In the above-mentioned manufacturing method of semiconductor devices, a through opening part may be formed at a center of the substrate material. Additionally, at least one through hole may be formed outside an area where the substrates are formed and within an area where a resin mold is formed. Further, a plurality of the through holes may be formed along a circumference of the area where the substrates are formed.

Additionally, there is provided according to another aspect of the present invention a manufacturing method of semiconductor devices, comprising: preparing a substrate sheet material in which a plurality of substrates used for producing the semiconductor devices are formed and at least one through hole is provided in an area other than an area where the substrates are formed; mounting a semiconductor chip onto each of the substrates off the substrate sheet material; resin-molding the mounted semiconductor chips all at once; introducing a mold resin through the through hole into a backside of the substrate sheet material opposite to a front side on which the semiconductor chips are mounted so as to form a resin part on the backside; forming semiconductor packages corresponding to the respective substrates; and individualizing the semiconductor packages.

The above-mentioned manufacturing method of semiconductor devices may comprise: forming a plurality of the through holes along a circumference of the resin part formed on the front side of the substrate sheet material; supplying the mold resin to the backside of the substrate sheet material through the plurality of through holes; and forming on the backside of the substrate sheet material a resin part having a shape along a circumference of the resin part formed on the front side.

Additionally, there is provided according to another aspect of the present invention a manufacturing method of semiconductor devices, comprising: preparing a circular semiconductor manufacturing material having a principal surface on which a plurality of electronic parts are formed; immersing the semiconductor manufacturing material into a dissolved resin; curing the dissolved resin; and cutting the semiconductor manufacturing material and the resin part on the principal surface together so as to separate into a plurality of resin coated chip-like electronic parts.

As mentioned above, according to the present invention, generation of a warp in the molded substrate sheet material can be suppressed by making the substrate sheet material into a circular shape. For this reason, a size of the substrate sheet material can be increased, which results in an increase in the number of substrates formed in a single substrate sheet material, and, thus, a cost reduction can be attempted.

Moreover, a various methods can be used as for the molding of semiconductor chips mounted on the substrate sheet material.

Furthermore, by making the substrate sheet material into a circular shape having the same size as a silicon wafer, a semiconductor manufacturing process for processing a silicon wafer can be applied to the manufacturing process of substrate sheet material and semiconductor packages without change, and, thus, a cost reduction is attempted.

Furthermore, according to the present invention, in order to make the substrate sheet material into a circular shape, the blank material is previously formed in a circular shape and the diameter thereof is made equal to a diameter of a silicon wafer used for manufacturing the semiconductor chip (semiconductor element) such as a diameter of 200 mm or 300 mm, and, thus, a process using a manufacturing apparatus used for manufacturing the semiconductor chip can be achieved. Accordingly, if a photography process for manufacturing a semiconductor chip (exposure, development, etching) is applied when forming wiring/electrodes on a part of the blank material where the substrates are formed, a finer pattern can be formed with a high accuracy.

Moreover, when mounting solder balls for external connection terminals after resin-molding or when cutting the resin mold part together with the substrate sheet material to individualize the semiconductor packages, a manufacturing apparatus for a so-called wafer level CSP can be applied. Such an application of the manufacturing apparatus for a wafer level CSP, when mounting solder balls for external connection terminals after resin-molding or when cutting the resin mold part together with the substrate sheet material to individualize the semiconductor packages, is also applicable to a case where wiring/electrodes are formed on a blank material and thereafter the blank material is cut to form a substrate sheet material.

Moreover, according to the present invention, generation of a warp in a substrate sheet material can be suppressed after a molding process by flowing a part of a resin, when molding one of principal surfaces of the substrate sheet material, to another principal surface of the substrate sheet material so as to form a resin part of a continuous frame or annular shape on the another principal surface.

Other objects, features and advantages of the present invention will become more apparent from the following detailed description when read in conjunction with the accompanying drawings.

BRIEF DESCRIPTION OF THE DRAWINGS

FIG. 30A is a plan view of a square blank material;

FIG. 30B is a side view of the square blank material shown in FIG. 30A;

FIG. 31 is a plan view of substrate sheet materials formed in the square blank material shown in FIGS. 30A and 30B;

DETAILED DESCRIPTION OF THE PREFERRED EMBODIMENTS

A description will now be given, with reference to the drawings, of a first embodiment of the present invention.

Figure 1:
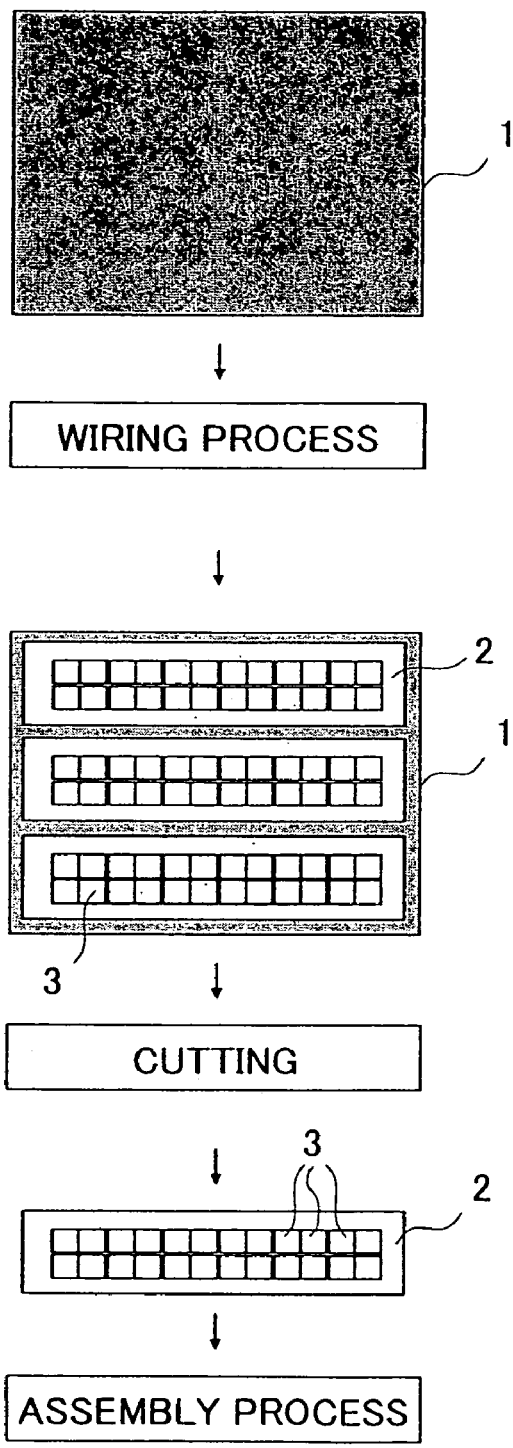
FIG. 1 is an illustration showing a process of manufacturing a semiconductor package from a fabrication of a substrate.
Figure 2A:
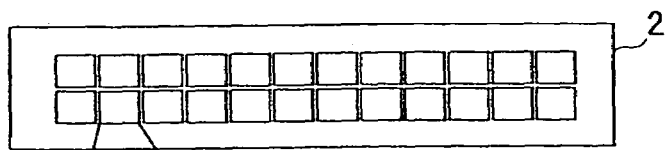
FIG. 2A is a plan view of a substrate sheet material.
Figure 2B:
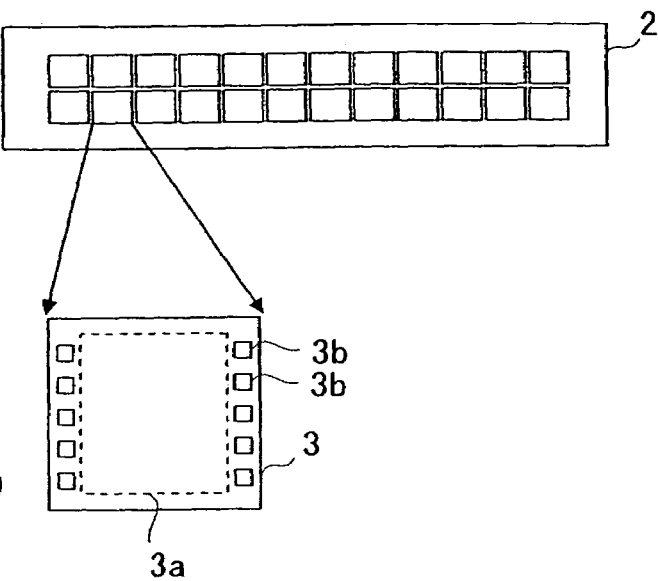
FIG. 2B is an enlarge plan view of one of substrates shown in FIG. 2A.
Figure 2C:
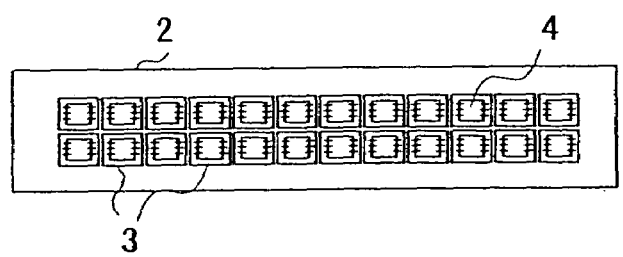
FIG. 2C is a plan view of the substrate sheet material on which semiconductor chips are mounted.
Figure 3A:
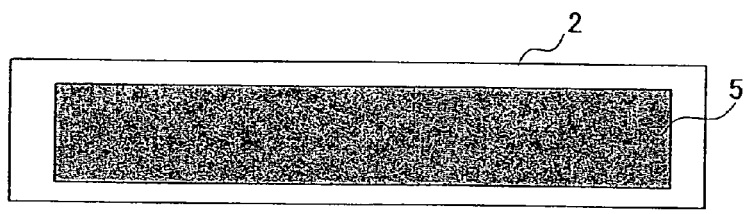
FIG. 3A is a plan view of a substrate sheet material having semiconductor chips molded at the same time.
Figure 3B:
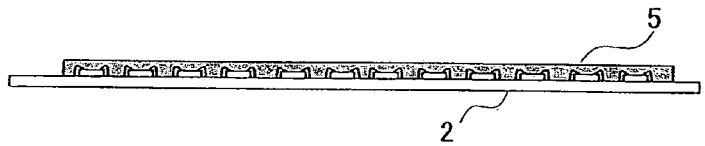
FIG. 3B is a side view of the substrate sheet material shown in FIG. 3A.
Figure 4:
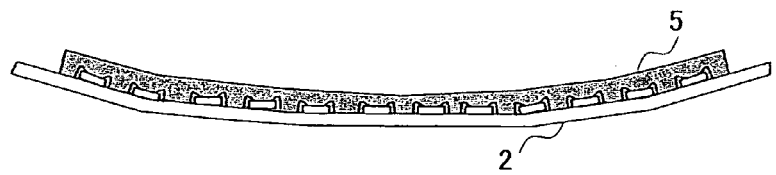
FIG. 4 is a side view of a warped substrate sheet material.
Figure 5:
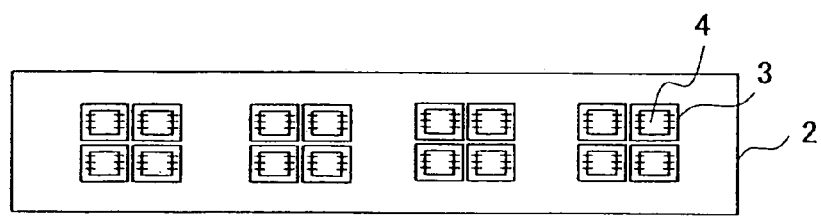
FIG. 5 is a plan view of a substrate sheet material on which a plurality of groups of semiconductor chips are mounted.
Figure 6A:
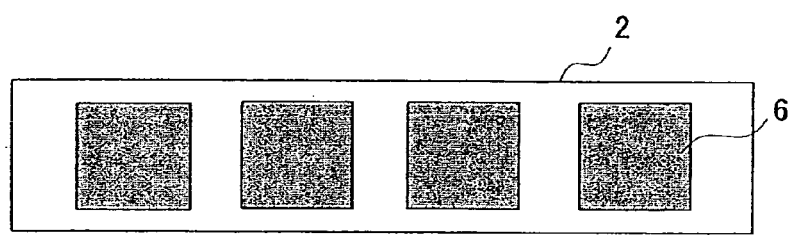
FIG. 6A is a plan view of the substrate sheet material having groups of semiconductor chips each of which is molded at the same time.
Figure 6B:
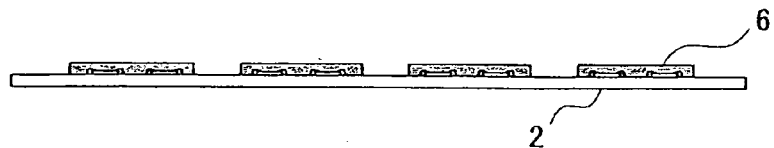
FIG. 6B is a side view of the substrate sheet material shown in FIG. 6A.
Figure 7A:
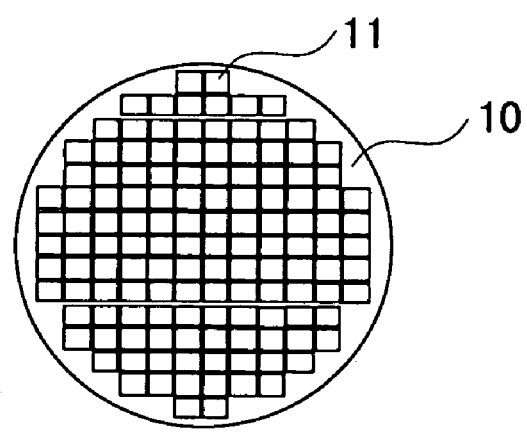
FIG. 7A is a plan view showing a structure of a substrate sheet material according to the present invention.
Figure 7B:
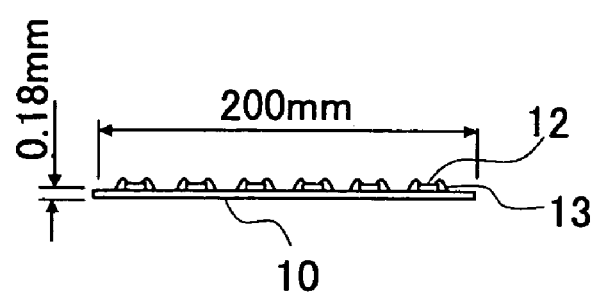
FIG. 7B is a side view of the substrate sheet material shown in FIG. 7A in a state where semiconductor chips (semiconductor elements) are mounted thereon.

The first embodiment according to the present invention is show in FIGS. 7A and 7B. FIG. 7A is a plan view showing a structure of a substrate sheet material according to the present invention. FIG. 7B is a side view of the substrate sheet material showing a state where semiconductor chips (semiconductor elements) are mounted and fixed onto substrates formed in the substrate sheet material and electrodes of the semiconductor chips are electrically connected to wiring/electrodes of the substrates.

As shown in FIG. 7A, in the present embodiment, the substrate sheet material 10 is configured as a circular shape. The substrate sheet material 10 shown in FIGS. 7A and 7B is formed by using a base material (blank material) made of a polyimide sheet or aforementioned material sheets with an electrically conductive material such as a copper (Cu) sheet formed on at least one of the main surfaces thereof.

The substrate sheet material 10 concerned is made into a multi-layer structure in which wiring is provided in a single layer or between layers in response to the semiconductor chip mounted on a substrate 11, and the thickness thereof is set to about 0.18 mm.

According to the present embodiment, the substrate sheet material 10 is formed in a circular shape with a diameter of 200 mm, and the substrates 11 are formed and arranged in a matrix so that the substrate 11 are formed as many as possible.

As shown in FIG. 7B, a semiconductor chip 12 is mounted onto each of the substrates 11, and electrodes of the semiconductor chips 12 are connected to pads of the substrates 11 by gold wires 13 using a dice bonder apparatus. In the present embodiment, each of the semiconductor chip 12 is formed in a 8-mm square and a thickness thereof is 0.14 mm.

After the semiconductor chips 12 are mounted onto all the substrates 11 and wire-bonding is performed with the golden wires 13, a resin mold is applied to all the semiconductor chips 12 of the substrate sheet material 10.

Figure 8:
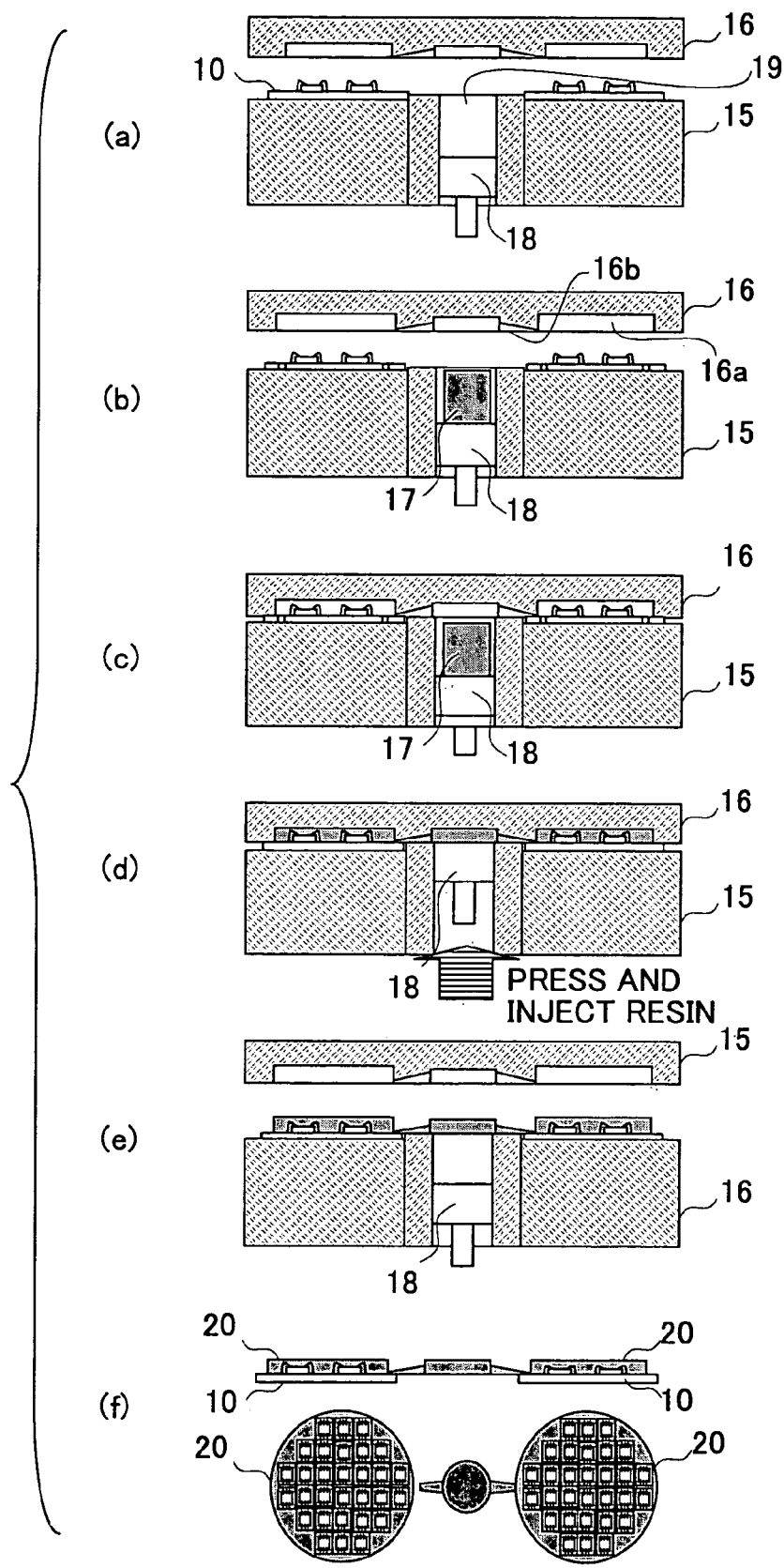
FIG. 8 is an illustration for explaining a process of resin-molding the semiconductor chips mounted on the substrate sheet material.

A process of resin molding the semiconductor chips 12 mounted on the substrate sheet material 10 is shown in FIG. 8. In the resin-molding process shown in FIG. 8, tow substrate sheet materials 10 are resin-molded at the same time. As shown in FIG. 8-(a), a lower die 16 and an upper die 16 are opened, and the substrate sheet materials 10 on which the semiconductor chips 12 are mounted are placed in predetermined positions of the lower die 15.

Figure 9:
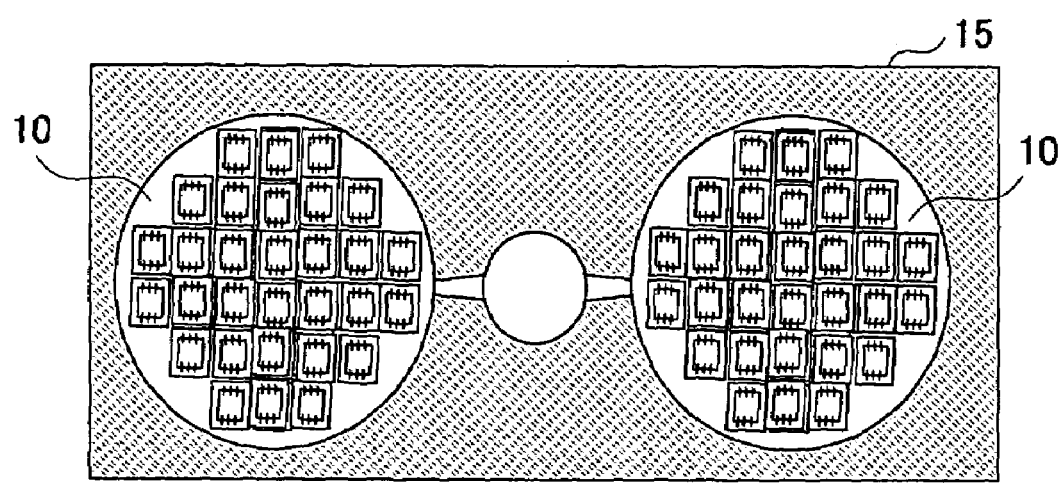
FIG. 9 is a plan view showing substrate sheet materials placed on a lower die.

FIG. 9 shows the substrate sheet materials 10 placed on the lower die 15.

In the present embodiment, the lower die 15 is configured so that two substrate sheet materials 10 can be placed side-by-side and a pot 19 is provided at a position between positions where the substrate sheet materials are placed.

On the other hand, the upper die 16 is provided with cavities 16a corresponding to each of the portions where the substrate sheet materials are placed, and runners 16b are provided to connect the pot 17 and each of the cavities 16a.

Next, as shown in FIG. 8-(b), a resin tablet 17 is placed in the pot 19, which is provided above a plunger 18. The resin tablet 17 may be referred to as "compacted tablet resin", and is generally formed by compacting powders of biphenyl epoxy into a tablet shape.

After placing the resin tablet 17, as shown in FIG. 8-(c), the upper and lower dies 15 and 16 are clamped. Then, the upper and lower dies 15 and 16 are heated at a temperature of 175° C. Therefore, if the plunger 18 is pushed up as shown in FIG. 8-(d), the resin tablet 17 is fluidized and flows into the cavities 16a of the upper die 16. Thereby, the mould of the semiconductor chips 12 on the substrate sheet materials 10 are resin-molded with the resin tablet.

Thereafter, as shown in FIG. 8-(e), the upper and lower dies 15 and 16 are opened, and the two substrate sheet materials 10 on which seal resin parts 20 are formed as shown in FIG. 8-(f) are taken out of the lower die 15.

The molded substrate sheet materials 10 are individualized into semiconductor packages by being cut by a dicing method as mentioned below.

Although the molding approach shown in FIG. 8 is a so-called transfer-mold method, a compression mold method can also be used to mold the substrate sheet material 10.

Figure 10:
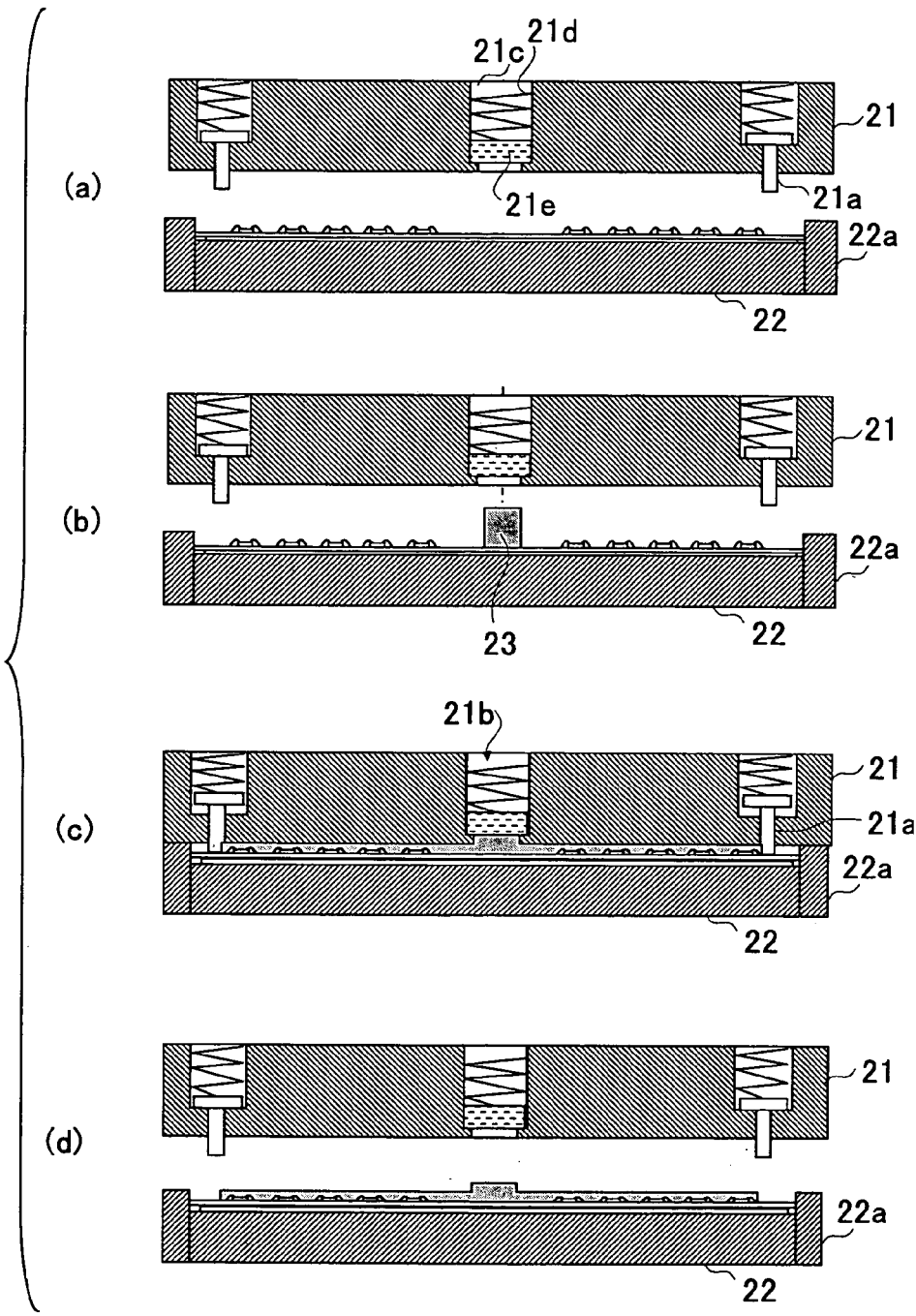
FIG. 10 is an illustration for explaining a compression mold method.

The mold process using the compression mold method is shown in FIG. 10.

As shown in FIG. 10-(a), an upper die 21 and a lower die 22 are opened, and the substrate sheet material 10 on which the semiconductor chips 12 are mounted is placed on the lower die.

Here, the lower die 22 comprises a circular base part 22a and a wall part 22b which surrounds the base part 22a so that a volume of the cavity formed by the upper and lower dies 21 and 22 and a height of a molded resin formation part can be determined by selecting a height of the wall part 22b into which the upper die 21 is brought into contact.

Next, as shown in FIG. 10-(b), a resin tablet 23 is placed at the center of the substrate sheet material 10. The resin tablet 23 is formed of the same material as the above-mentioned resin tablet 17. Then, as shown in FIG. 10-(c), the lower die 22 is moved upward so as to close the dies. At this time, the dies are heated, and the resin tablet 23 is melted and flows on the substrate sheet material 10. After the dies close completely, the resin is pressurized and the whole surface of the substrate sheet material 10 is filled up with the resin. After filling of the resin is completed, the upper die 21 and the lower die 22 are opened, and the molded substrate sheet material 10 is take out of the dies.

It should be noted that the above-mentioned upper die 21 is provided with a ring-like resin stop material 21a formed of the same material as the mold dies so that the resin stop material is brought into contact with the upper surface of the circular substrate sheet material 10 by being pressed by a spring 21b when the dies are closed so as to prevent the resin from being flowing out to a periphery of the substrate sheet material 10. Moreover, a cylindrical opening 21c is provided at the center part of the upper die 21 corresponding to the center part of the circular substrate sheet material to be processed, and a lid 21e, which is movably supported in up and down directions by a spring 21d in the opening 21e so as to constitute an excessive resin absorbing mechanism.

The excessive resin absorbing mechanism absorbs an excessive resin into the cylindrical opening 21c sue to the lid 21e being pressed upward by the excessive resin when an amount of resin consumed by the cavity is changed due to, for example, a change in the number of semiconductor chips mounted on the substrate sheet material.

Moreover, the resin mold of the semiconductor chips 12 can be performed by a spin coat method other than the above-mentioned mold method by utilizing that the substrate sheet material has a circular shape.

Figure 11:
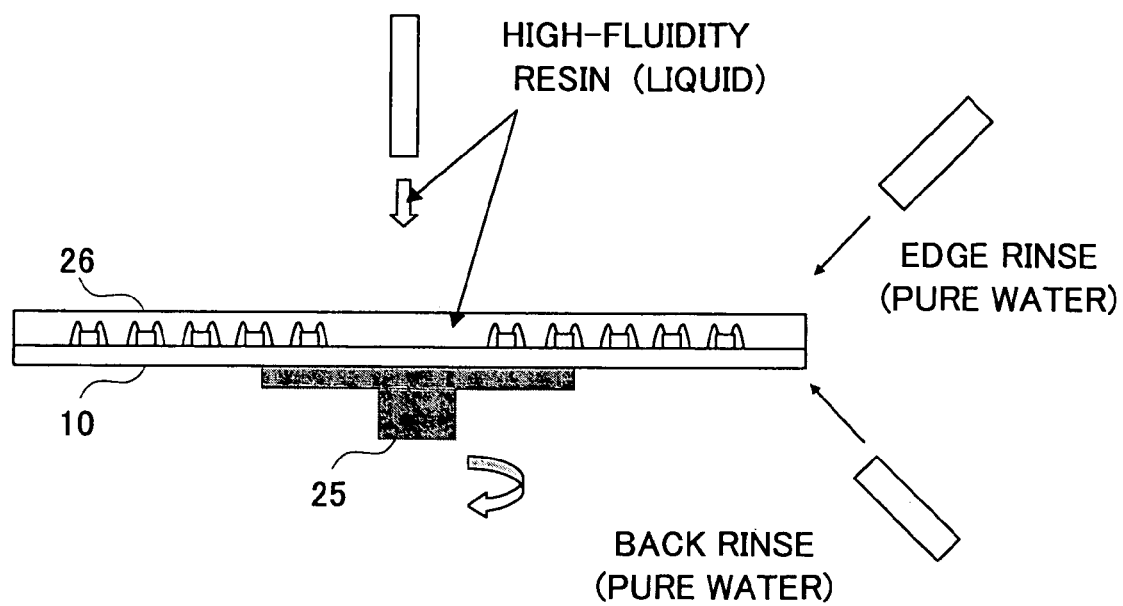
FIG. 11 is an illustration for explaining a resin encapsulating process using a spin coat method.

A process of resin-molding the semiconductor chips 12 mounted on the substrate sheet material 10 by a spin coat method at the same time is shown in FIG. 11.

The circular substrate sheet material 10 in the state where the semiconductor-chips 12 are mounted is placed on a rotation table 25, and is fixed by vacuum.

Then, the rotation table 25 is rotated at 100 rpm, a liquefied resin is dropped near the center of the rotating substrate sheet material 10. A rotating speed is increased gradually up to 500 rpm within five minutes.

Thereby, the liquefied resin flows in directions from the center to a periphery from by a centrifugal force, and the substrate sheet material 10 is covered by a resin layer 26 of a uniform thickness, which results in the semiconductor chips 12 embedded into the resin layer 26.

After the resin layer 26 is formed over the entire substrate sheet material 10, the rotation of the rotation base 25 is stopped, and the resin layer 26 is cured by heat.

It should be noted that, while the liquefied resin is flowing by the centrifugal force, a pure water is dropped at an outermost periphery of the circular substrate sheet material 10 so as to stop the flow of the liquefied resin at the outermost periphery (which is referred to an edge rinse). Moreover, a pure water is injected at the backside of the substrate sheet material 10 while being rotated so as to prevent the liquefied resin from going into the backside (which is referred as a back rinse).

As mentioned above, according to the present embodiment, a resin mould can be performed by forming the substrate sheet material 10 into a circular shape and using the spin coat method, which was not able to apply to the conventional rectangular or strip-shaped substrate sheet material.

Moreover, as other mold methods, a combination of the above-mentioned compression mold method and the above-mentioned vacuum mold method. Such a method is especially preferable as a method of molding the substrate sheet material 10 of the present embodiment.

Figure 12:
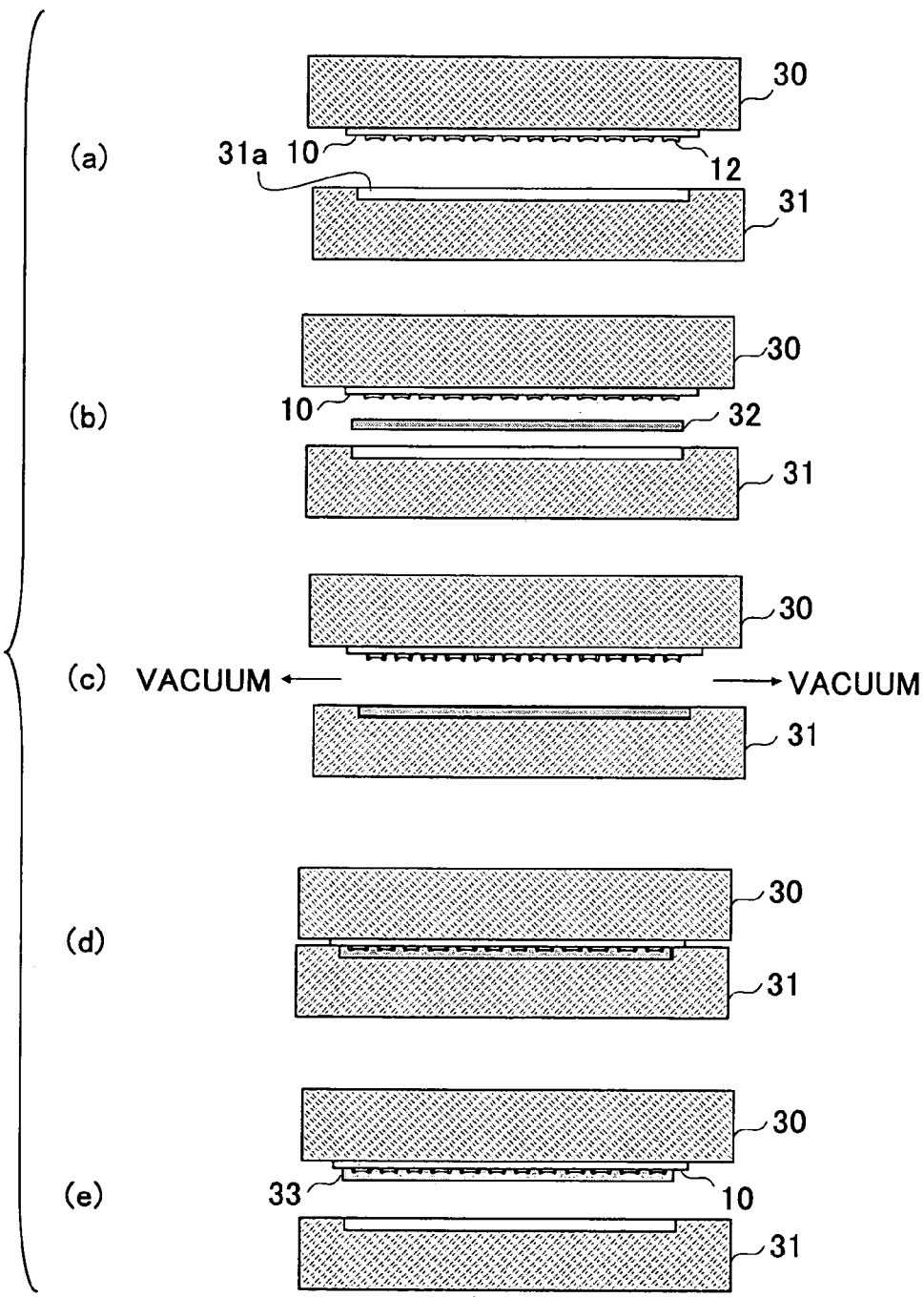
FIG. 12 is an illustration for explaining a molding process which is a combination of a compression mold method and a vacuum mold method.

A process of molding the substrate sheet material 10 by the method of combination of the compression mold method and the vacuum mold method is shown in FIG. 12.

As shown in FIG. 12-(*a*), dies are opened, and the substrate sheet material 10 is attached to an upper die 30 with the semiconductor chip 12 facing downward.

On the other hand, as shown in FIG. 12-(*b*), a resin tablet 32 is placed in a cavity 31*a* of a lower die 31. The resin tablet 32 is previously formed into a circle having a size slightly smaller than the dimension of the circular substrate sheet material 10. Instead of resin tablet 32, the cavity 31*a* of the lower die 31 may be filled with a granular resin.

The upper and lower dies are heated at 170° C., for example, and the resin tablet 32 placed inside the cavity 31*a* is softened and is turned into a gel.

Then, while evacuating the dies as shown in FIG. 12-(*c*), the upper and lower dies are closed as shown in FIG. 12-(*d*). Under such a circumstance, a pressure is applied to a gelatinized resin in the cavity 31 due to a clamping pressure of the dies, and the gelatinized resin is filled in the cavity 31*a* without forming a gap so as to cover the surface of the substrate sheet material 10. Since the dies are closed while being evacuated, air bubbles do not enter the resin.

After the resin is cured and a mold resin part 33 is formed in the dies, the dies are opened and the molded substrate sheet material 10 is taken out of the upper mold die 30 as shown in FIG. 12-(*e*).

As mentioned above, if the compression mold method and the vacuum mold method are combined with each other, there is no need to fluidize the resin on the surface (the surface on which the semiconductor chips 12 are mounted) of the substrate sheet material 10 when resin-molding. Therefore, various problems caused by fluidization of the resin, such as a problem of deformation of gold wires 13 due to fluidization of the resin or a problem of exfoliation of the semiconductor chips 12 due to the fluidization of the resin, can be prevented.

A description will now be given, with reference to FIG. 13, of another method of molding the circular substrate sheet material.

Figure 13:
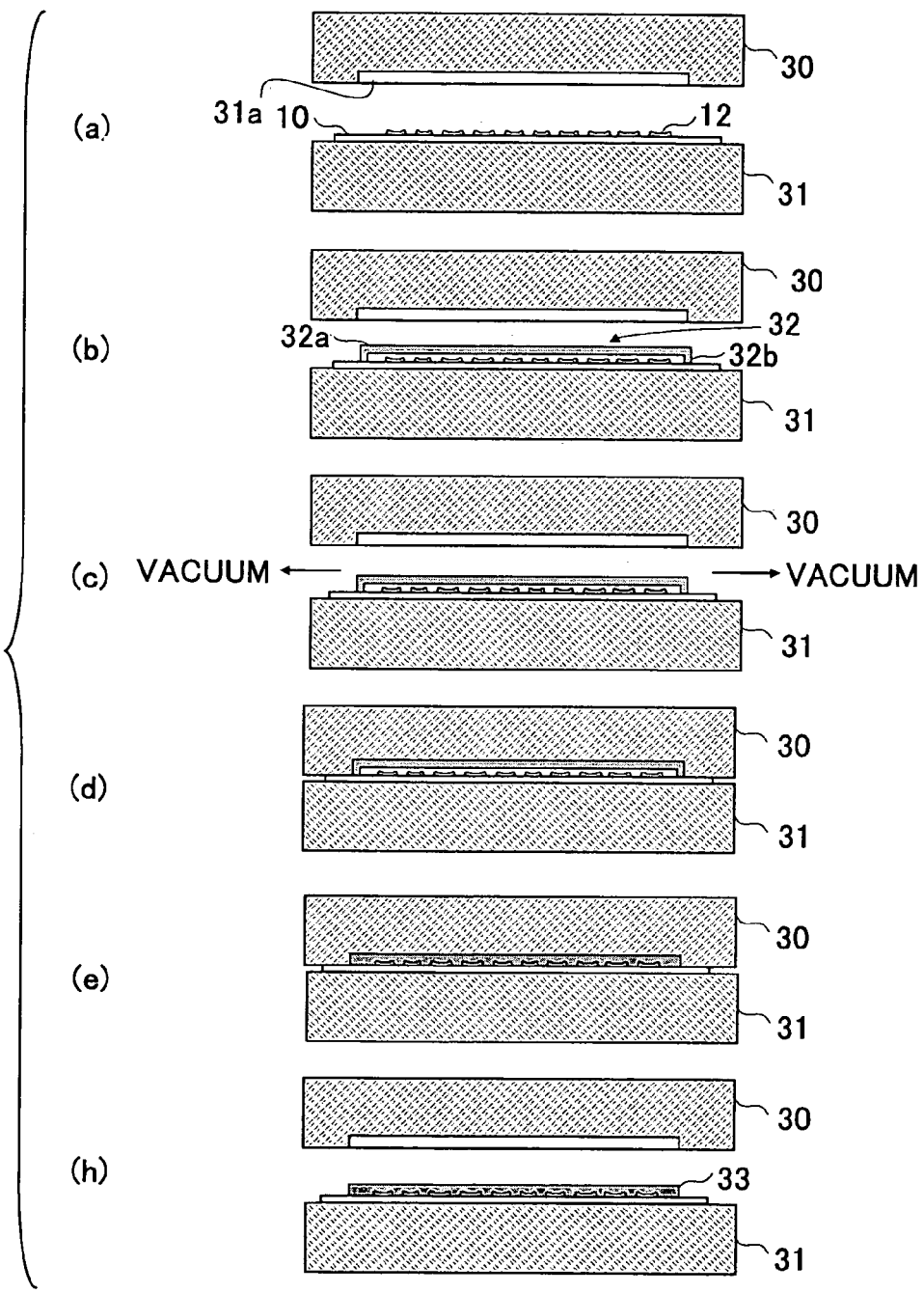
FIG. 13 is an illustration for explaining another molding process which is a combination of a compression mold process and a vacuum mold method.

As shown in FIG. 13-(*a*), the upper and lower dies are opened, and the circular substrate sheet material 10 is placed in a position of the lower die 31 corresponding to the cavity 30*a* of the upper die 30 with the semiconductor chips 12 facing upward. The diameter of the opening of the circular cavity 30*a* is made slightly smaller than the diameter of the circular substrate sheet material 10 so that the upper die 39 can be brought into contact with the periphery of the upper surface of the circular substrate sheet material to when closing the dies.

Then, as shown in FIG. 13-(*b*), a resin formed material 32 is placed so as to cover the semiconductor chips 12 on the substrate sheet material 10. The resin formed material 32 has a shape which can be accommodated in the cavity 30*a*, and a fringe 32*b* thereof is previously made into a height at which a flat part 32*a* does not contact the semiconductor chips 12 and/or lead wires extending from the semiconductor chips 12.

Subsequently, the upper and lower dies are heated at 170° C., for example, and the upper die 30 is moved downward while evacuating the atmosphere, as shown in FIG. 13-(*c*).

Then, as shown in FIG. 13-(*d*), the upper die 30 is brought into contact with the formed resin material 32 and also with the periphery of the upper surface of the circular substrate sheet material 10, and continues the heating. At this time, the evacuation in the atmosphere of the dies is continued.

As a result, formed resin material 32 is softened and starts to melt, and, the melted resin 32*c* covers the semiconductor chips 12 in the cavity as shown in FIG. 13-(*e*).

After the resin is cured within the dies and a mold resin part 33 is formed, the pair of dies are opened and the molded substrate sheet material 10 is taken out of the lower die 31.

When a mold resin part having a diameter of 185 mm and a thickness of 0.6 mm was formed on the substrate sheet material having a diameter of 200 mm by using the above-mentioned method, a warp of the substrate sheet material was about 1 mm at the maximum. If a warp is such a degree, the molded substrate sheet material can be handled without problem in a subsequent semiconductor assembly process.

On the other hand, when the molded resin part was formed on a rectangular substrate sheet material having a width of 70 cm and a length of 185 cm according to a conventional method using the same resin, a warp of the substrate sheet material was 3 mm. Such a large degree of warp may cause a problem in a subsequent individualization process.

Figure 14:
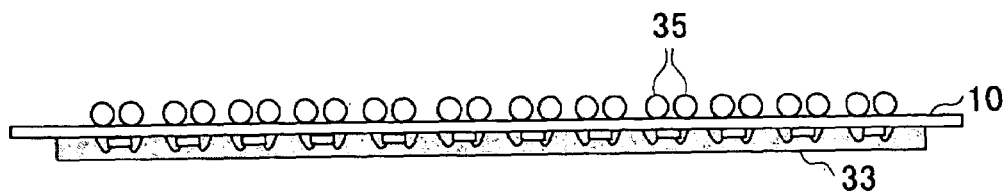
FIG. 14 is a side view of a substrate sheet material provided with solder balls.

As shown in FIG. 14, solder balls 35 as external connection terminals are provided on the back side (the surface which is not molded) of the substrate sheet material 10 which has been subjected to the resin molding process according to the above-mentioned method of the present invention. Accordingly, a plurality of semiconductor devices are consecutively formed on the substrate sheet material 10.

Figure 15:
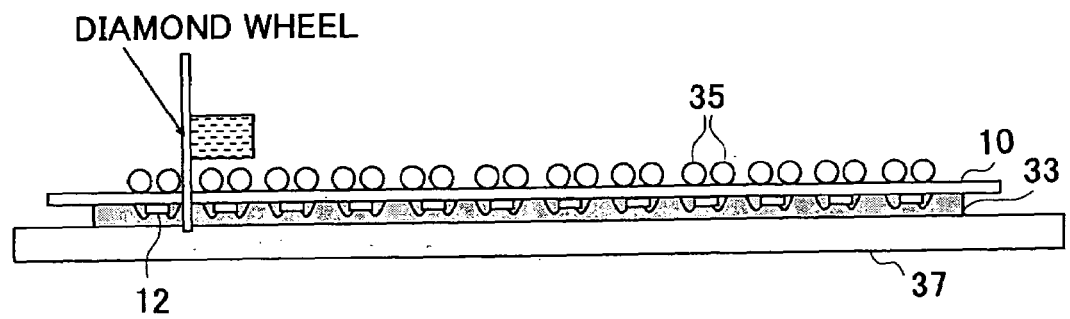
FIG. 15 is an illustration for explaining a cutting process to cut a molded substrate sheet material.
Figure 16:
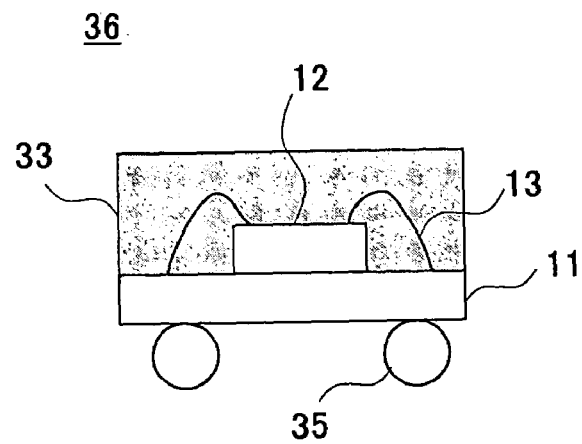
FIG. 16 is a cross-sectional view of a completed semiconductor package.

Then, as shown in FIG. 15, the substrate sheet material 10 is subjected to a cutting process, and is individualized as semiconductor packages 36 as shown in FIG. 16.

In the cutting process, an UV tape 37 is applied to the molded resin part 33 of the substrate sheet material 10, and the substrate sheet material 10 is fixed with the backside facing upward. Then, the substrate sheet material 10 and the molded resin part 33 are cut by a diamond blade, and, thereby, the semiconductor devices 36 are completed by being individualized by the cutting. The semiconductor package shown in FIG. 16 is a so-called BGA type semiconductor device.

Here, although FIG. 13 and FIG. 15 show the state where the resin-molding process has been performed, the semiconductor chips are shown for the sake of indicating a relationship between the external connection terminals or a positional relationship between the cutting diamond blade.

It should be noted that the mold processing method show in FIG. 12 and FIG. 13 can be applied to a resin-molding process in a manufacturing process of a so-called chip size package (CSP) type semiconductor device such as shown in Japanese Laid-Open Patent Application No. 10-79362.

In the mold processing method shown in FIG. 12, the depth of the cavity 31*a* is determined in response to a height of protrusion electrodes or bumps provided on the semiconductor substrate, and the surfaces of an insulating layer and a wiring layer on the semiconductor substrate between the protrusion electrodes or the bumps are covered by a resin.

Moreover, in the mold processing method shown in FIG. 13, the depth of the cavity 30*a* (the height of the inner space) is determined in response to a height of protrusion electrodes or bumps provided on the semiconductor substrate, and the surfaces of an insulating layer and a wiring layer on the semiconductor substrate between the protrusion electrodes or the bumps are covered by a resin.

Furthermore, according to the present invention, since the substrate sheet material 10 is in a circular shape, a resin can be supplied from the center of the substrate sheet material in the mold process of the circular substrate sheet material having a plurality of semiconductor chips mounted on one of main surfaces thereof.

That is, an opening having a size suitable for supplying the mold resin is provided at the center of the circular substrate sheet material so that the resin can be caused to flow in radial directions from the opening toward the periphery of the circular substrate sheet material.

Figure 17A:
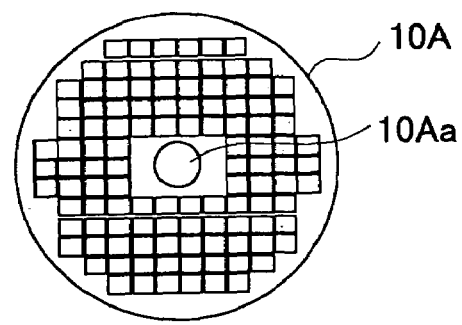
FIG. 17A is a plan view of a circular substrate sheet material having an opening formed in the center thereof.
Figure 17B:
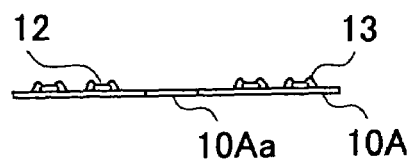
FIG. 17B is a front view of the circular substrate sheet material shown in FIG. 17B.

A circular substrate sheet material 10A having such an opening formed in the center thereof is shown in FIG. 17. FIG. 17A is a plan view of the circular substrate sheet material, and FIG. 17B is a front view of the circular substrate sheet material shown in FIG. 17B. In FIGS. 17A and 17B, parts that are the same as the parts shown in FIG. 7 are given the same reference numerals, and descriptions thereof will be omitted. It should be noted that FIG. 17B shows a state where semiconductor chips are mounted onto the substrate sheet material.

As shown in FIG. 17, a circular opening 10Aa is provided in the center of the circular substrate sheet material 10A, and, thereby, the substrate sheet material 10A is formed in a doughnut-like shape as a whole. When the diameter of the substrate sheet material 10A is set to 200 mm, the diameter of the circular opening 10Aa is preferably about 20 mm. However, the diameter of the opening 10Aa is not limited to 20 mm, and any size can be adopted if the resin can pass therethrough as mentioned later.

The distance at which the resin flows can be equal to the radius of the substrate sheet material 10A at the maximum by providing the opening 10Aa in the center and introducing the resin from the backside to the front side through the opening 10Aa as is in the substrate sheet material 10 shown in FIG. 17, which can sufficiently shorten the distance to flow. Therefore, the resin can be efficiently spread all over the substrate sheet material 10A.

Figure 18:
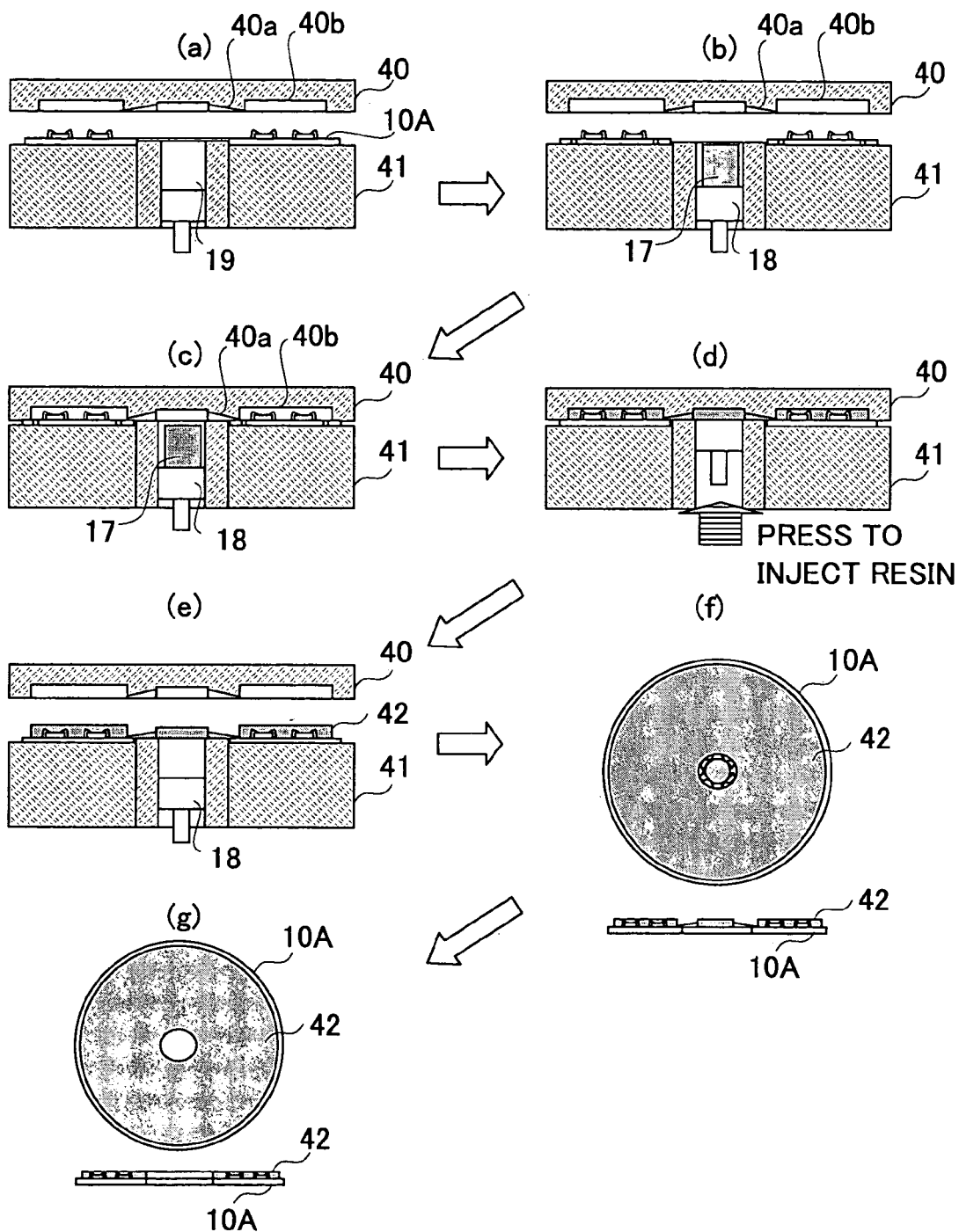
FIG. 18 is an illustration for explaining a molding process of a substrate sheet material.

A molding process of the substrate sheet material 10A provided with the opening 10Aa in the center thereof is shown in FIG. 18.

Figure 19:
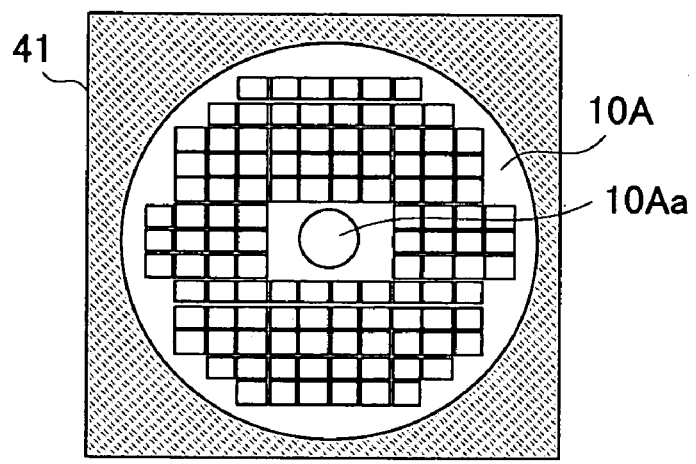
FIG. 19 is an illustration for explaining a molding process of the substrate sheet material shown in FIGS. 17A and 17B.

As shown in FIG. 18-(a), a lower die 40 and an upper die 41 are opened, and the substrate sheet material 10A on which the semiconductor chips 12 are mounted is placed in a predetermined position of the lower die 40. FIG. 19 shows the substrate sheet material 10A placed on the lower die 40.

Next, as shown in FIG. 18-(b), the resin tablet 17 is arranged in the pot 19 provided above the plunger 18.

After placing the resin tablet 17, as shown in FIG. 18-(c), the upper and lower dies 40 and 41 are clamped. The upper and lower dies 40 and 41 are heated, for example, at a temperature of 175° C. Therefore, when the plunger 18 is pushed up as shown in FIG. 18-(d), the resin tablet 17 is fluidized and flows into a cavity 40b of the upper die 40 through runners 40a from the center part of the substrate sheet material 10A. Thereby, the semiconductor chips 12 on the substrate sheet material 10A are molded by the fluidized resin tablet.

Although the runners 40a can be provided along four directions, for example, extending from an area above the pot 19 to the cavity 40b, the runners 40a may be formed in response to all inner surfaces of the cavity 40b.

Thereafter, as shown in FIG. 18-(e), the upper and lower dies 40 and 41 are opened, and the substrate sheet material 10A on which a seal resin part 42 is formed as shown in FIG. 18-(f) is taken out of the lower die 41.

Since the resin (cull) remaining in the area above the pot 19 and in the opening 10Aa in the area on a pot 19 and the runners is integrally formed with the molded substrate sheet material 10A, the cull is removed as shown in FIG. 18-(g), and the mold of the substrate sheet material 10A is completed.

The molded substrate sheet material 10A is individualized in the same manner as mentioned above.

As mentioned above, according to the present invention, by making the substrate sheet material into a circular shape, a warp of the substrate sheet material after being molded can be suppressed while increasing a number of substrates formed in a single substrate sheet material. Moreover, the molding of the substrate sheet material can also use various approaches.

The semiconductor manufacturing process for manufacturing silicon wafers can be applied to the manufacturing process of the substrate sheet material or the semiconductor device by making the substrate sheet material into a circular shape which is the same as the silicon wafers, and, thus, a reduction in the manufacturing cost can be attempted. For example, although a high positional accuracy is required for an exposure/development process of a photo-resist in the manufacturing process of the substrate sheet material, such a high accuracy can be achieved by using the manufacturing process of a silicon wafer.

A description will now be given of a substrate sheet material according to a second embodiment of the present invention.

Figure 20:
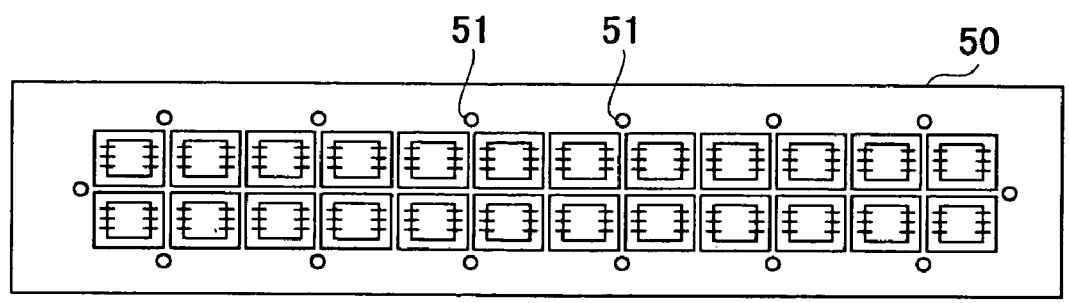
FIG. 20 is a plan view of a substrate sheet material according to a second embodiment of the present invention.

The substrate sheet material according to the second embodiment of the present invention is shown in FIG. 20. In FIG. 20, parts that are the same as the parts shown in FIG. 7 are given the same reference numerals, and descriptions thereof will be omitted.

The substrate sheet material 50 shown in FIG. 20 is formed in the same rectangular shape as a conventional substrate sheet material, and a plurality of small through holes 51 are provided at predetermined position of the substrate sheet material 50. A diameter of the thorough holes 51 is about 1 mm. The substrate sheet material 50 is made of a glass epoxy material of a rectangle shape having a width of 70 mm and a length of 200 mm, and is formed in a state where the substrates 11 are consecutively connected and aligned along two rows.

The through holes 51 are arranged in or near an area where the resin-molding is performed outside an area where the substrates 11 are formed. In the example shown in FIG. 20, the through holes 51 are provided outside the area of the substrate connected in two rows and in a part corresponding to a part between the adjacent substrates 11.

The through holes 51 are provided for causing the resin flowing to the backside of the substrate sheet material 50 when molding, and thus, the diameter of the through holes 51 is not limited to 1 mm and holes having a size which allows the resin passing therethrough can be used.

Figure 21:
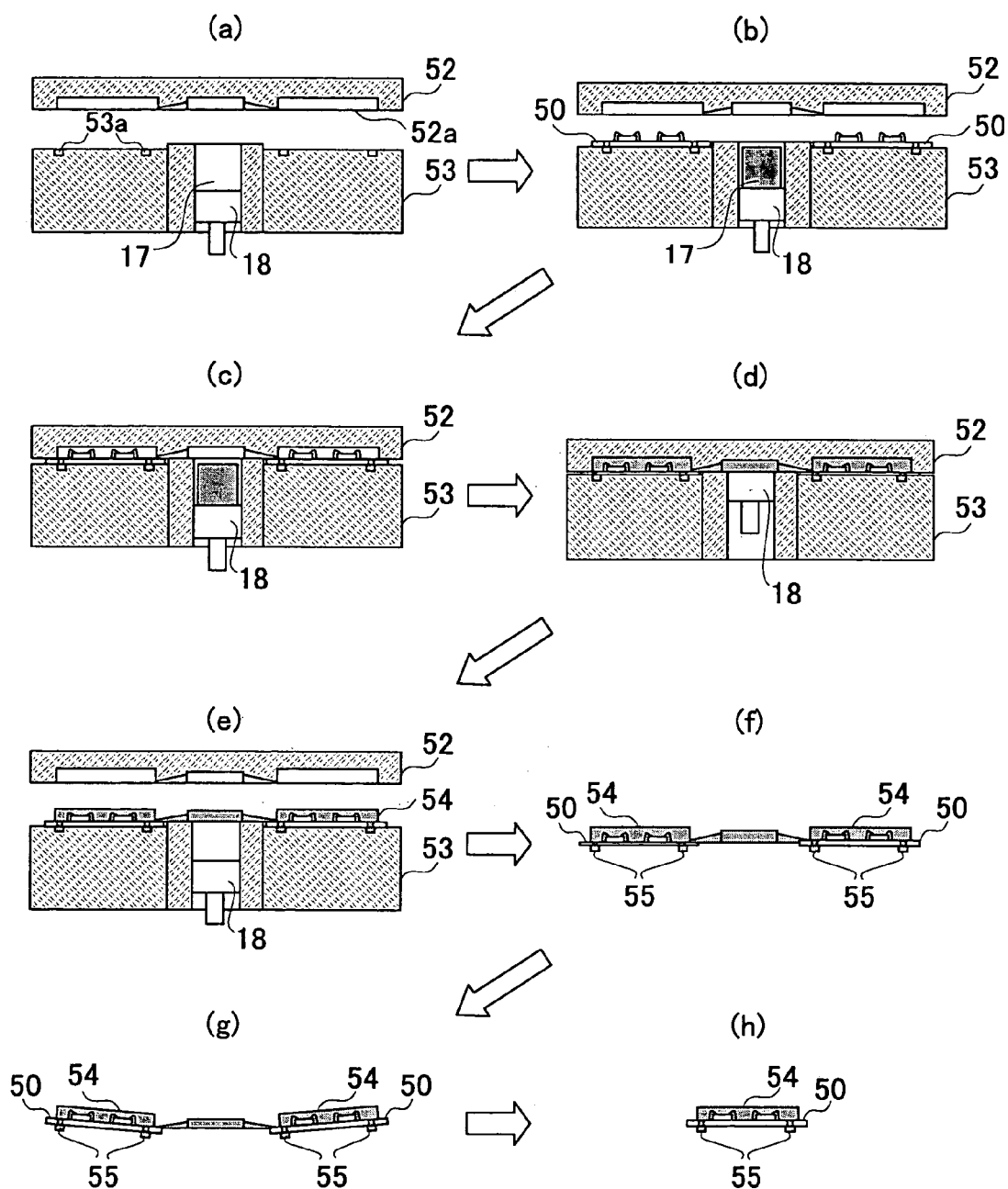
FIG. 21 is an illustration for explaining a molding process of the substrate sheet material shown in FIG. 20.

A process of molding the substrate sheet material 50 shown in FIG. 20 is shown in FIG. 21.

As shown in FIG. 21-(a), a lower die 52 and an upper die 53 are opened, and, as shown in FIG. 21(b), two sheets of the substrate sheet material 50 on which the semiconductor chips 12 are mounted are placed in predetermined positions of the lower die 52, and the resin tablet 17 is placed in the pot 19 which is provided above the plunger 18. Cavities 52a are formed in the upper die 52 so as to accommodate parts in which the semiconductor chips 12 are mounted, and the semiconductor chips 12 are resin-molded by filling a resin in the cavities 52a.

As shown in FIG. 21-(a), in the present embodiment, groove-like backside cavities 53 are formed in the lower die 53. The backside cavities are grooves extending along the through holes 51 of the substrate sheet material 50 so that the mold resin can enter the cavities 53a through the through holes 51.

After placing the resin tablet 17, as shown in FIG. 21-(c), the upper and lower dies 52 and 53 are clamped. The upper and lower dies 52 and 53 are heated, for example, at a temperature of 175° C. Therefore, when the plunger 18 is pushed up as shown in FIG. 21-(d), the resin tablet 17 is fluidized and flows into cavities 52a of the upper die 52. Thereby, the semiconductor chips 12 on the substrate sheet material 50 are molded by the fluidized resin tablet. At this time, a part of the resin entering into the cavities 52a flows to the backside of the substrate sheet materials 50 through the through holes 51 and is filled in the backside cavities 53a.

Thereafter, the upper and lower dies are opened as shown in FIG. 21-(e), and the substrate sheet materials 50 having seal resin parts 54 formed on the front side and backside resin parts 55 formed on the backside as shown in FIG. 21-(f), are taken out of the lower die 53.

Since the two substrate sheet materials 50 are connected by gates and culls as shown in FIG. 21-(g), the culls are removed and the substrate sheet materials 50 on which the seal resin parts 54 are formed are completed as shown in FIG. 21-(h).

The molded substrate sheet materials 50 are individualized into semiconductor devices as mentioned above. When individualizing the semiconductor devices, the backside resin parts 55 are positioned outside the area in which the semiconductor devices are arranged, and are cut off as unnecessary parts.

Figure 22A:
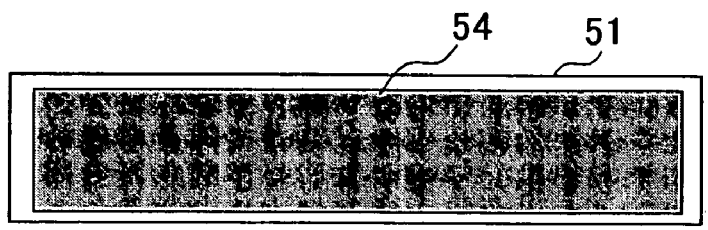
FIG. 22A is a plan view of a molded substrate sheet material 50.
Figure 22C:
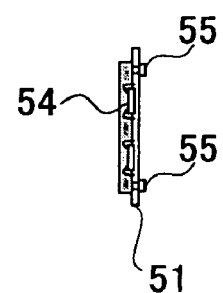
FIG. 22C is a side view of the molded substrate sheet material shown in FIG. 22A.
Figure 22B:
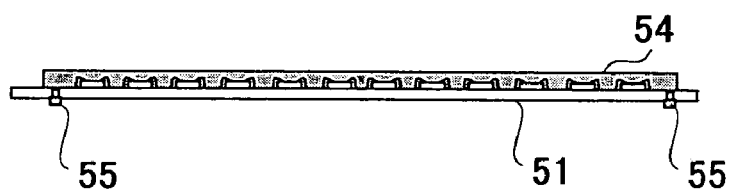
FIG. 22B is a cross-sectional view of the molded substrate sheet material shown in FIG. 22A.
Figure 22D:
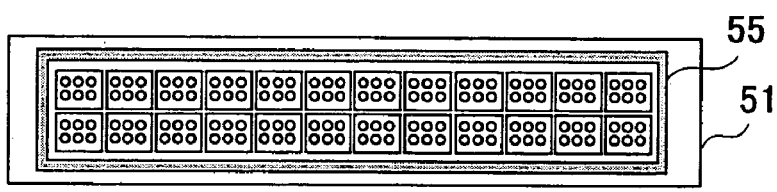
FIG. 22D is a bottom view of the molded substrate sheet material shown in FIG. 22A.

The substrate sheet material 50 made through the above-mentioned molding process is shown in FIGS. 22A through 22D. FIG. 22A is a plan view of the molded substrate sheet material 50, FIG. 22B is a cross-sectional view of the molded substrate sheet material 50, FIG. 22C is a side view of the molded substrate sheet material 50, and FIG. 22D is a bottom view of the molded substrate sheet material 50.

As shown in FIG. 22A, the seal resin part 54 is formed on the front side of the substrate sheet material 50, and the semiconductor chips 12 are encapsulated by the seal resin part 54. Moreover, as shown in FIG. 22D, the backside resin part 55 is continuously formed in a frame shape on the backside of the substrate sheet material 50 in a position corresponding to the periphery of the seal resin part 54 in the front side.

If only the seal resin part 54 is provided as is in a conventional one, a large warp is generated in the substrate sheet material 50 due to compression of the seal resin part 54. However, in the present embodiment, since the backside resin part 55 is formed on the backside of the substrate sheet material 50, compressions of the backside resin part 55 and the seal resin part 54 are cancelled, thereby suppressing generation of a warp in the substrate sheet material 50.

Therefore, even if one seal resin part is formed over the whole surface of the substrate sheet material 50, a large warp is not generated as is in a conventional substrate sheet material, and, thus, larger number of substrates 11 can be formed in a single substrate sheet material than a conventional one.

Although the above-mentioned substrate sheet material 50 has a rectangular shape, generation of warp in the circular substrate sheet material according to the above-mentioned first embodiment can be suppressed by providing through holes in the circular substrate sheet material so as to form a backside resin part.

Figure 23A:
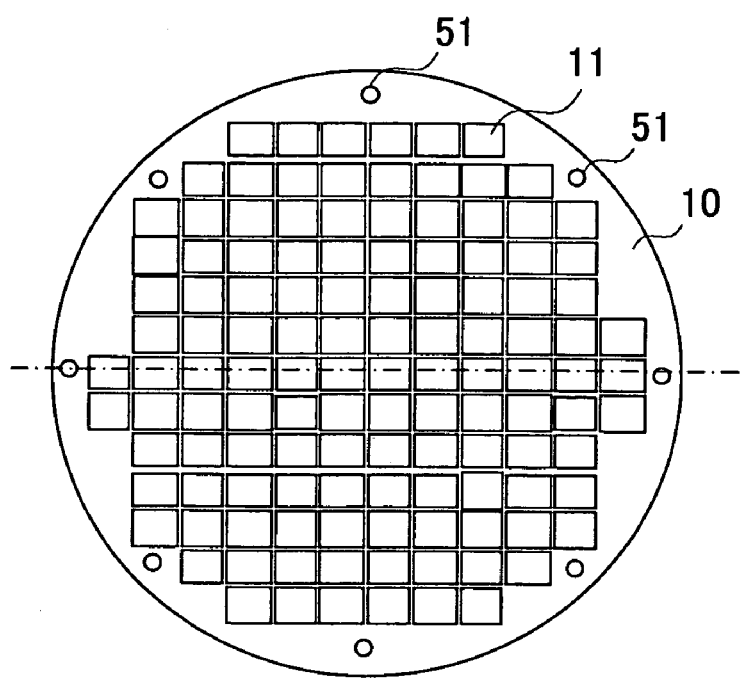
FIG. 23A is a plan view of a circular substrate sheet material provided with a plurality of through holes.
Figure 23B:
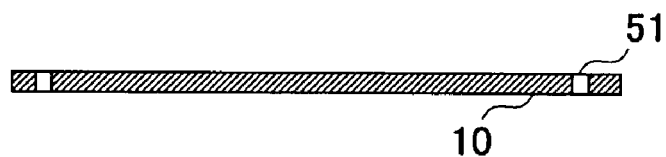
FIG. 23B is a cross-sectional view of the substrate sheet material shown in FIG. 23B.

An example in which a plurality of though holes 51 are provided in the circular substrate sheet material 10 shown in FIG. 7 is shown in FIGS. 23A and 23B. FIG. 23A is a plan view of the circular substrate sheet material provided with a plurality of through holes, and FIG. 23B is a cross-sectional view of the substrate sheet material shown in FIG. 23B.

Figure 24A:
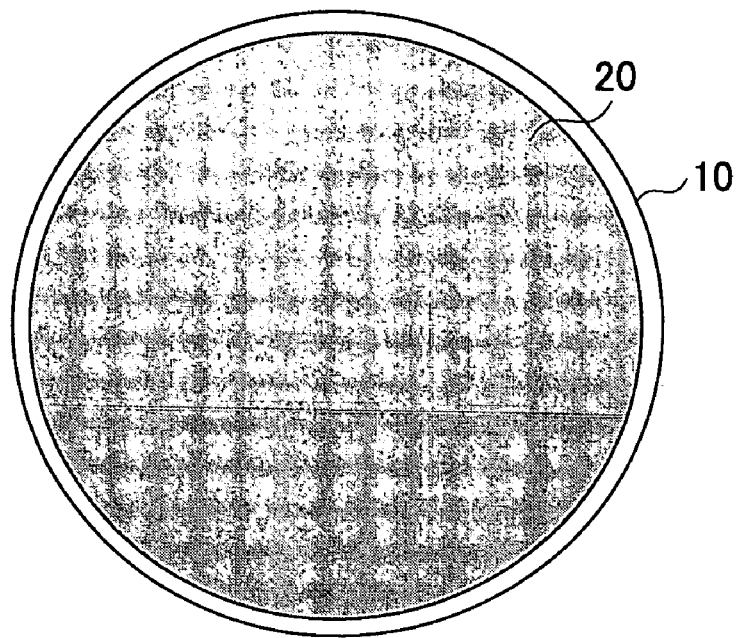
FIG. 24A is a plan view of the molded substrate sheet material shown in FIGS. 23A and 23B.
Figure 24B:
FIG. 24B is a cross-sectional view of the molded substrate sheet material shown in FIG. 24A.

Moreover, FIGS. 24A is a plan view of the molded substrate sheet material 10 shown in FIGS. 23A and 23B, and FIG. 24B is a cross-sectional view of the molded substrate sheet material shown in FIG. 24A.

The substrate sheet material 10 is provided with the seal resin part 20 formed on the front side thereof, and an annular backside resin part 55 is formed on the backside of the substrate sheet material 10. Generation of a warp is suppressed due to the presence of the backside resin part 55.

Figure 25A:
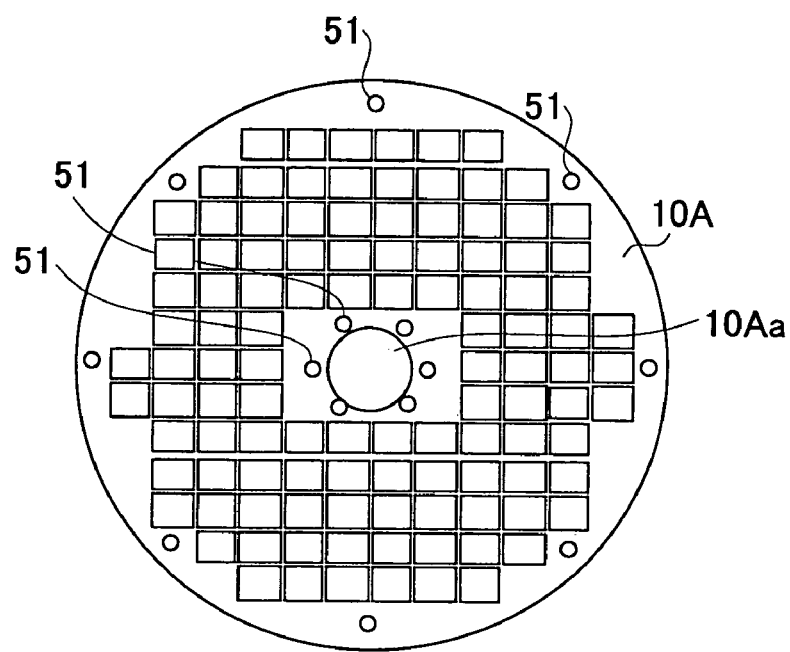
FIG. 25A is a plan view of a doughnut-shaped substrate sheet material provided with a plurality of through holes.
Figure 25B:
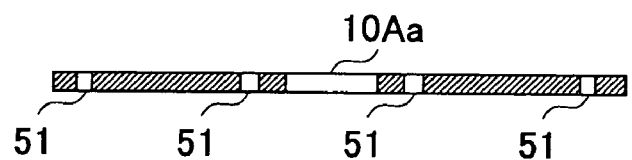
FIG. 25B is a cross-sectional view of the substrate sheet material shown in FIG. 25B.

An example in which a plurality of through holes 51 are provided in the doughnut-shaped substrate sheet material 10A shown in FIG. 17 are shown in FIGS. 25A and 25B. FIG. 25A is a plan view of the doughnut-shaped substrate sheet material 10A provided with a plurality of through holes, and FIG. 25B is a cross-sectional view of the substrate sheet material shown in FIG. 25B.

Figure 26A:
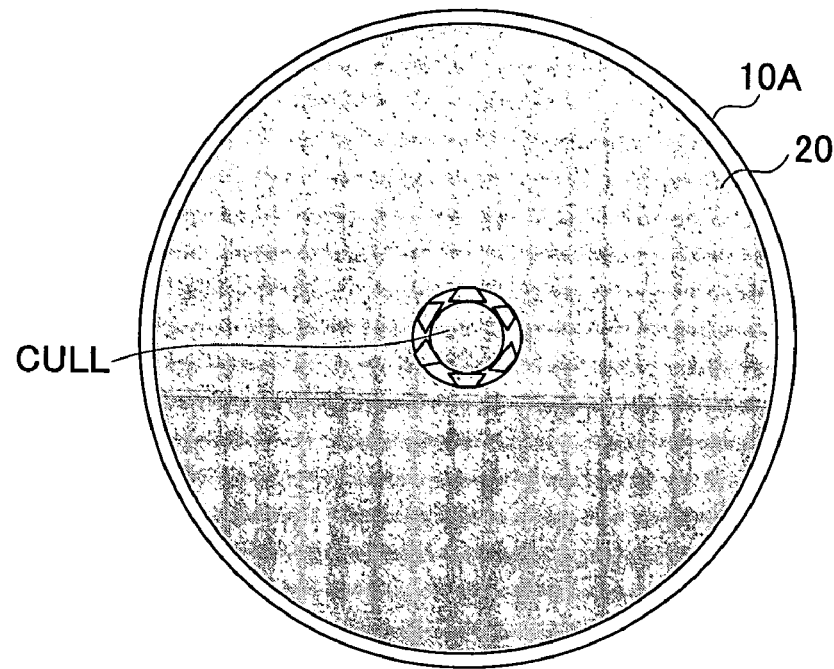
FIG. 26A is a plan view of a molded substrate sheet material.
Figure 26B:
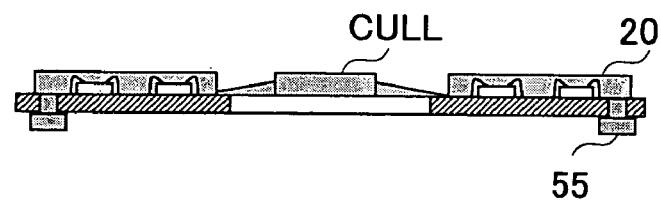
FIG. 26B is a cross-sectional view of the molded substrate sheet material shown in FIG. 26A.

Moreover, the molded substrate sheet material 10A shown in FIGS. 25A and 25B is shown in FIGS. 26A and 26B. FIG. 26A is a plan view of the molded substrate sheet material 10A, and FIG. 26B is a cross-sectional view of the molded substrate sheet material shown in FIG. 26A.

The substrate sheet material 10A is provided with the seal resin part 20 formed on the front side thereof, and an annular backside resin part 55 is formed on the backside of the substrate sheet material 10A. However, the substrate sheet material shown in FIGS. 26A and 26B does not use the through holes 51 provided in the periphery of the central opening 10Aa, and the backside resin part 55 is provided only in a position on the backside corresponding to the periphery of the seal resin part 20. Generation of a warp is suppressed due to the presence of the backside resin part 55.

Figure 27A:
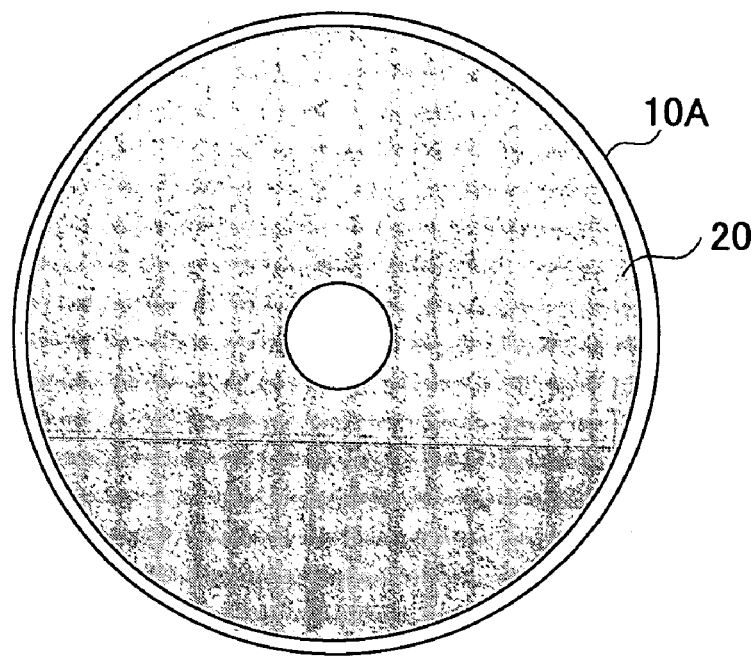
FIG. 27A is a plan view of a molded substrate sheet material.
Figure 27B:
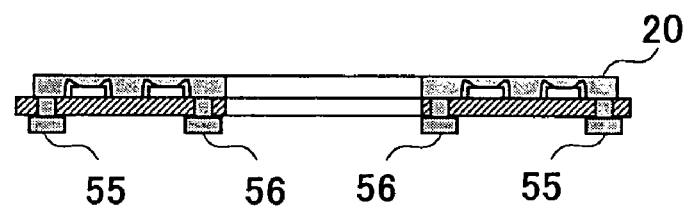
FIG. 27B is a cross-sectional view of the molded substrate sheet material shown in FIG. 27A.

A state where the substrate sheet material 10A shown in FIGS. 25A sand 25B is molded is shown in FIGS. 27A and 27B. FIG. 27A is a plan view of the molded substrate sheet material, and FIG. 27B is a cross-sectional view of the molded substrate sheet material shown in FIG. 27A.

The substrate sheet material 10A is provided with the seal resin part 20 formed on the front side thereof, and an annular backside resin part 55 is formed on the backside of the substrate material sheet 20. In FIGS. 27A and 27B, another backside resin part 56 is formed on the backside along the through holes 51 provided in the periphery of the central opening 10Aa, which further prevents generation of a warp in the substrate sheet material 10A.

In the structures of the circular substrate sheet materials 10 and 10A (including the doughnut-shaped substrate sheet material), the annular backside resin part provided on the backside thereof is formed, similar to the embodiment shown in FIGS. 21A through 22D, by providing an annular groove in the lower die in a position corresponding to the positions of the through holes of the substrate sheet material so as to cause the resin flowing into the groove through the through holes when molding.

A description will now be given of a process of producing the circular substrate sheet material 10 or 10A according to the above-mentioned first embodiment.

Figure 28A:
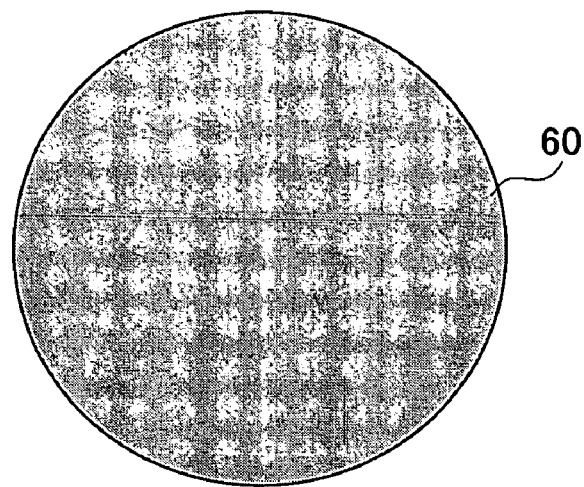
FIG. 28A is a plan view of a circular substrate sheet material.
Figure 28B:
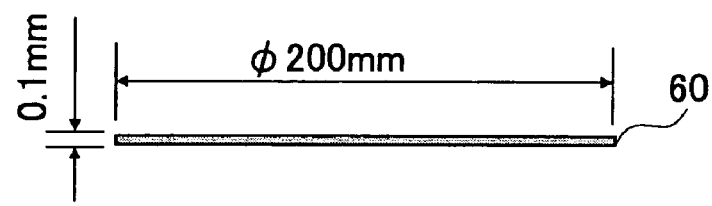
FIG. 28B is a front vie of the circular substrate sheet material shown in FIG. 28A.

FIGS. 28A and 28B show a blank material 60 for producing the circular substrate sheet material 10 or 10A. FIG. 28A is a plan view of the circular substrate sheet material and FIG. 28B is a front vie of the circular substrate sheet material shown in FIG. 28A.

The blank material 60 shown in FIGS. 28A and 28B is made of a glass epoxy material with a diameter of 200 mm and a thickness of 0.1 mm. The circular substrate sheet material 10 or 10A is formed by forming wiring on the blank material 60. By forming wirings on both sides of the blank material 60, the thickness of the substrate sheet material 10 or 10A becomes about 0.18 mm.

Figure 29:
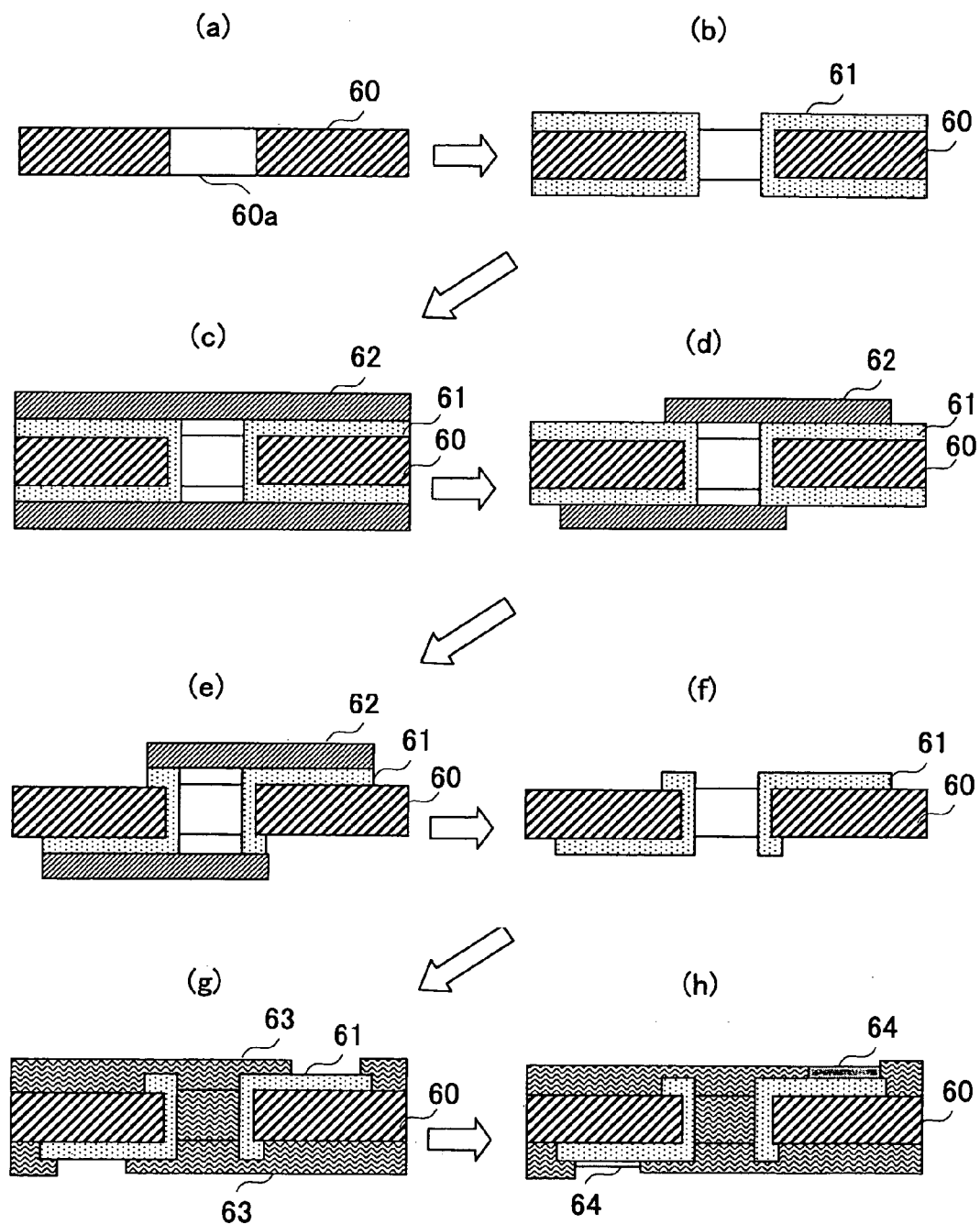
FIG. 29 is an illustration for explaining a process of forming wiring on a blank material shown in FIGS. 27A and 27B.

A wiring process applied to the blank material 60 is shown in FIG. 29.

As shown in FIG. 29-(a), a through hole 60a is formed in a predetermined part of the blank material 60, and a electroless copper plating layer 61 is formed as shown in FIG. 29-(b).

Next, as shown in FIG. 29-(c), a dry film resist 62 is applied onto the copper plating layer 61, and, as shown in FIG. 29-(d), exposure and development are performed so as to form the dry film resist 62 in a predetermined pattern.

Then, as shown in FIG. 29-(e), the copper plating layer 61 is etched by using the dry resist film 62 as a mask so as to form a predetermined.

Thereafter, as shown in FIG. 29-(f), the dry film resist 62 is removed, and, as shown in FIG. 29-(g), a solder resist 63 is printed on the surface of the copper plating layer 61 and the surface of the blank material 60.

Then, as shown in FIG. 29-(h), a nickel and gold plating layer is formed on the exposed copper plating layer, and the substrate sheet material 10 is completed.

It should be noted that, as mentioned above in the present invention, a substrate material having a conductive material such as a copper (Cu) plating layer formed on at least one main surface of a polyimide sheet or a glass-epoxy sheet is used as a blank material as well as a sole resin material such as a polyimide sheet or a glass-epoxy sheet. Therefore, the resin material in the state where the copper (Cu) plating layer shown in FIG. 29-(b) is previously formed is also considered as a blank material.

Although the above-mentioned example uses the circular blank material 60, a square or rectangular blank material 65 shown in FIG. 30 can also be used.

The blank material 65 is made of, for example, a glass-epoxy material with a side length of 330 mm and a thickness of 0.1 mm. As shown in FIG. 31, wiring is previously formed on the square blank material so that the substrates 11 are arranged-within a circle.

Figure 32:
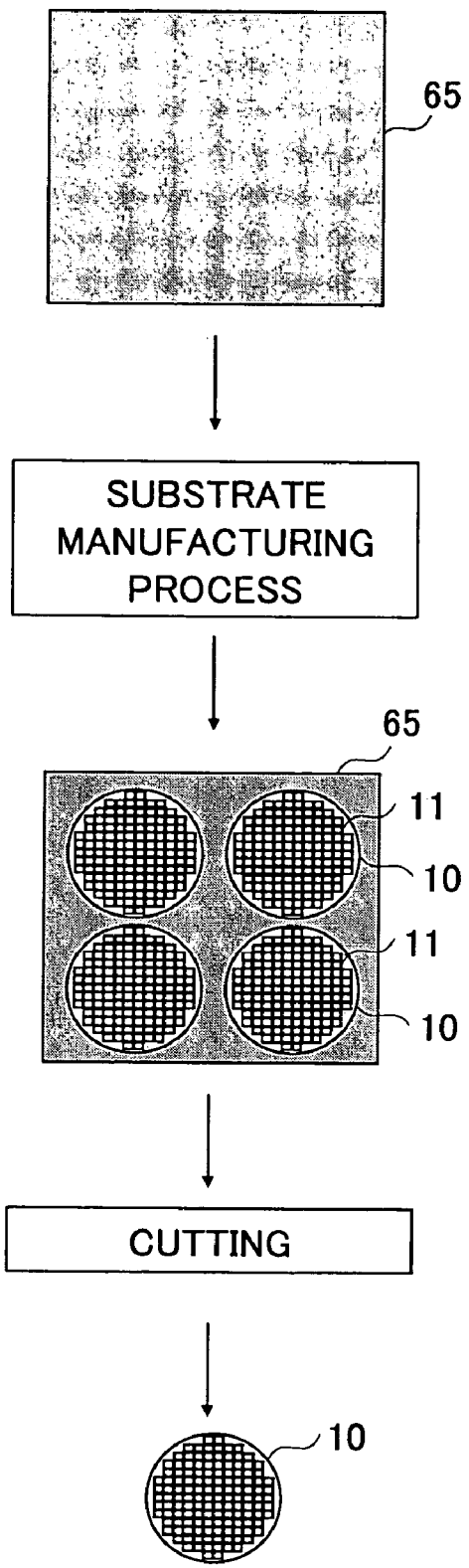
FIG. 32 is an illustration for explaining a process of forming a circular substrate sheet material using the square blank material shown in FIGS. 30A and 30B.

That is, as shown in FIG. 32, the square blank material 65 is prepared first, and wiring is previously formed on the blank material 65 so that the substrates 11 are arranged within four circles having a diameter of 150 mm in a substrate manufacturing process.

After completion of the wiring process, a plurality of substrates 11 arranged in the circular areas (corresponding to circular substrate sheet materials) are formed in the blank material 65. Thereafter, the circular areas are cut out so as to be substrate sheet materials. The diameter and the number of the substrate sheet materials are not limited to the above-mentioned example.

A description will now be given, with reference to FIGS. 33 and 34, of a manufacturing method of electronic parts according to the present invention. In the above-mentioned embodiments, a semiconductor device is formed by using a substrate sheet material made of epoxy, etc. and mounting a plurality of semiconductor chips on the substrate sheet material. However, in a manufacturing method of electronic parts described below, a plurality of semiconductor chips (electronic parts) are formed on a circuit formation surface (principal surface) of a silicon wafer as a semiconductor manufacturing material, and the electronic parts are individualized after being resin-molded.

Figure 33:
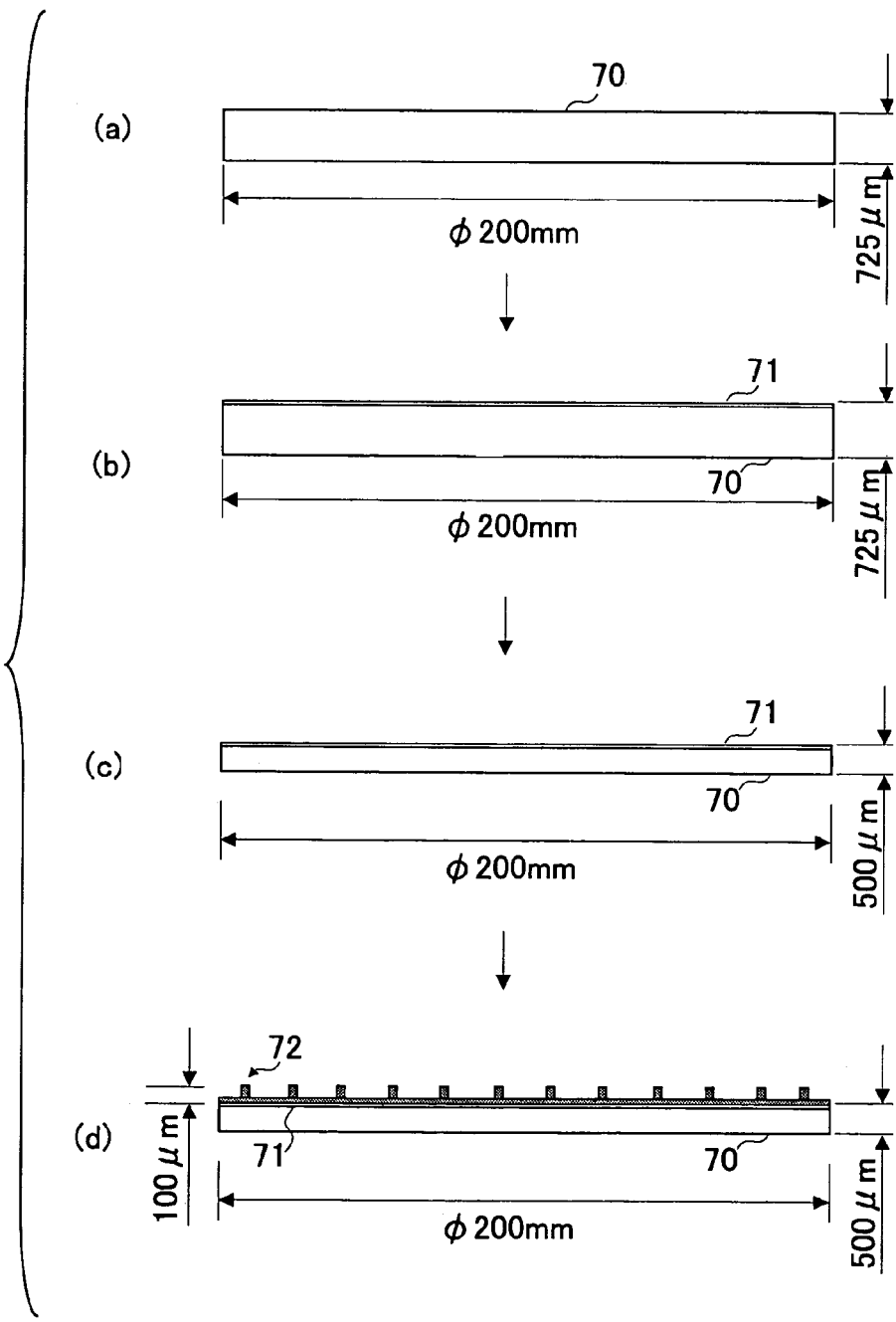
FIG. 33 is an illustration for explaining a process of forming a plurality of semiconductor chips on a silicon wafer.

As shown in FIG. 33-(a), a silicon wafer 70 is prepared. In the present embodiment, the diameter of the silicon wafer is 200 mm and a thickness is 725 µm. Next, as shown in FIG. 33-(b), a plurality of semiconductor chips (electronic parts) 71 are formed on the circuit formation surface (principal surface) of the silicon wafer 70 using photolithography. The process of forming the semiconductor chips 71 can be performed using a well-known photolithography, and description thereof will be omitted.

After the semiconductor chips (electronic parts) 71 are formed on the silicon wafer 70, the back surface, which is opposite to the principal surface of the silicon wafer, is ground (back grind) as shown in FIG. 33-(c) so as to set the thickness of the silicon wafer 70 to a desired thickness (500 µm in this embodiment).

Thereafter, as shown in FIG. 33-(d), wiring parts 72 are formed on the semiconductor chips 71. The wiring parts 72 can be formed by a well-known method such as a method of applying an insulating material such as polyimide onto a copper layer and forming copper (Cu) wiring by photolithography, and a description thereof will be omitted.

After forming the plurality of semiconductor chips 71 on the silicon wafer 70 in the above-mentioned process, the semiconductor chips 71 are resin-molded on the silicon wafer 70.

Figure 34:
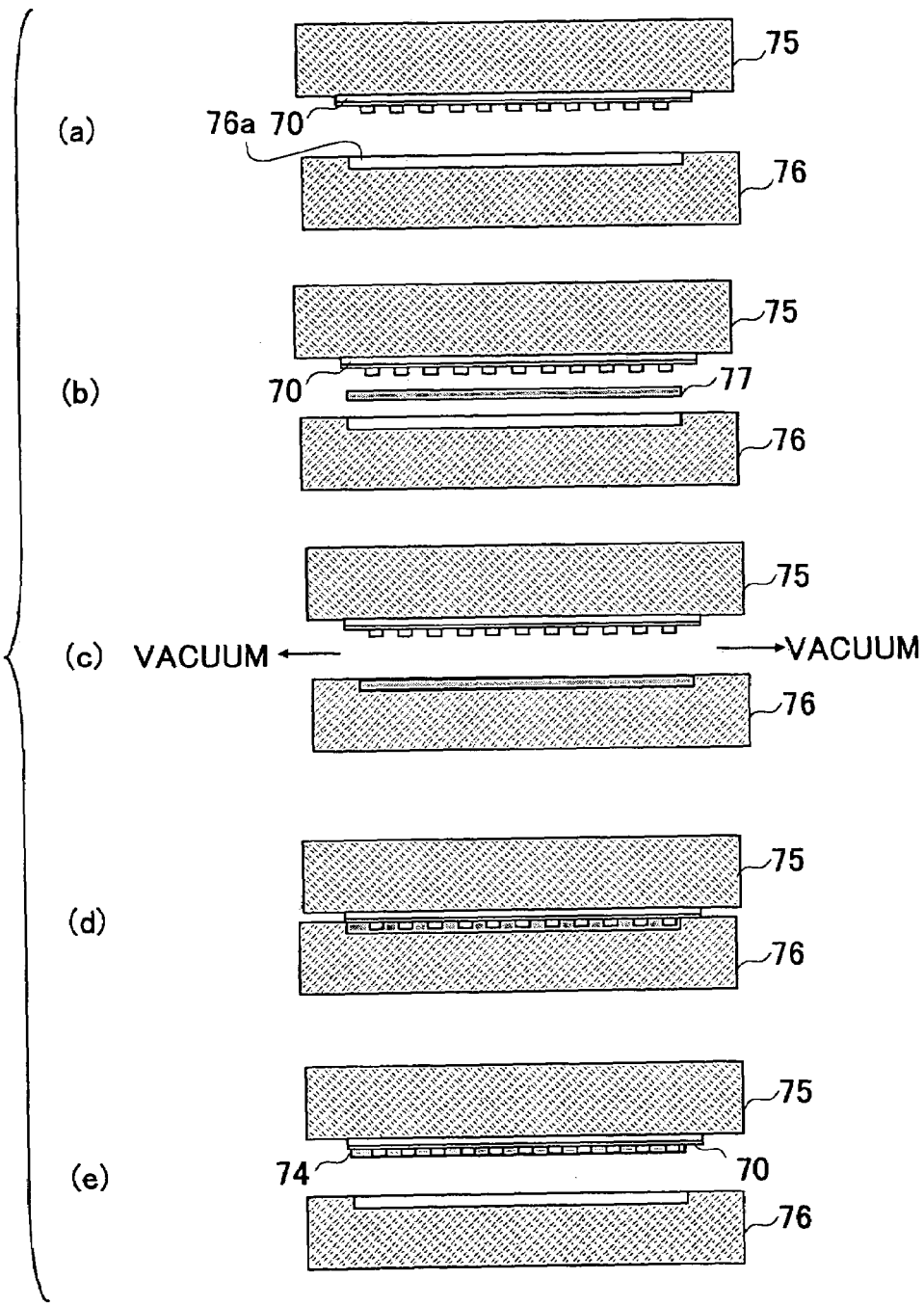
FIG. 34 is an illustration for explaining a process of molding a silicon wafer by a method which is a combination of a compression mold method and a vacuum mold method.

A process of resin-molding the silicon wafer is shown in FIG. 34.

As shown in FIG. 34-(a), dies are opened, and the silicon wafer 70 is mounted to an upper die 75 with the principal surface facing downward. Then, as shown in FIG. 34-(b), a resin tablet 77 is placed in a cavity 76a of a lower die 76 in this case, resin tablet 77 is formed in a circular shape slightly smaller than the circular silicon wafer 70 so as to cover approximately the entire surface of the silicon wafer 70. Instead of resin tablet 77, granular resin may be filled in the cavity 76a of the lower die 76.

The upper and lower dies are heated at, for example, about 170° C., and the resin tablet 77 is softened and gelatinized when placed in the cavity 76a. Then, the upper and lower dies are closed as shown in FIG. 34-(d) while evacuating the dies as shown in FIG. 34-(c).

Under such circumstances, a pressure is applied to the gelatinized resin in the cavity 76a due to a clamping pressure of the dies, and the gelatinized resin is filled in the cavity 76a so as to cover the surface of the silicon wafer without a gap. Since the dies are closed while being evacuated, air bubbles do not enter the resin.

After the resin is cured in the dies and the mold resin part 74 is formed, the dies are opened as shown in FIG. 34-(e) so as to take the molded silicon wafer 70 out of the upper die 75.

Figure 35:
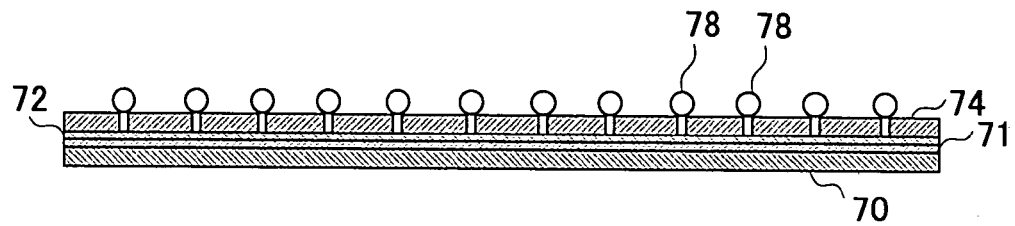
FIG. 35 is a side view of a molded silicon wafer provided with solder balls.

The taken-out silicon wafer 70 is in a state where the principal surface thereof is encapsulated by the mold resin part 74 and wiring for external connection terminals are exposed on the surface of the mold resin part 74. Thus, as shown in FIG. 35, solder balls 78 are formed on the wiring for external connection terminals that are exposed on the mold resin part 74 so as to from external connection terminals, which results in a plurality of semiconductor packages formed and consecutively arranged on the silicon wafer 70.

Figure 36:
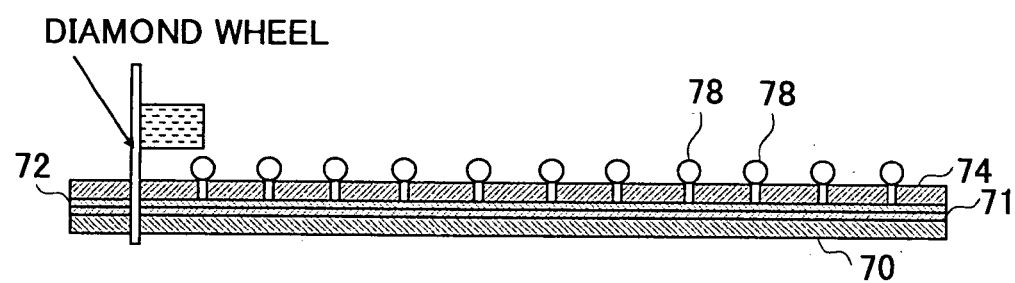
FIG. 36 is an illustration for explaining a cutting process of the molded silicon wafer shown in FIG. 35.
Figure 37:
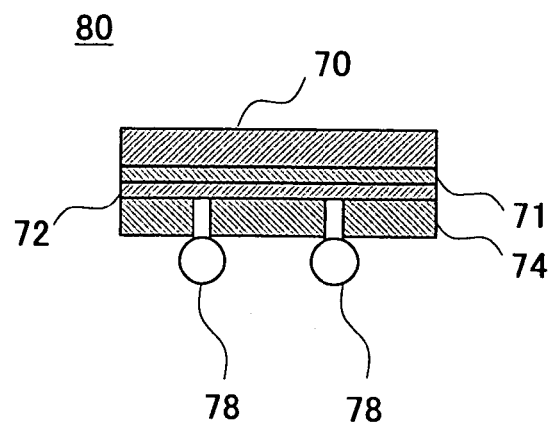
FIG. 37 is a cross sectional view of a completed semiconductor device.

Thereafter, as shown in FIG. 36, the silicon wafer is cut in a cutting process as shown FIG. 36, and individualized into semiconductor devices as shown in FIG. 37. Such a semiconductor package is generally referred to as a wafer level chip-size package (WL-CSP).

In the cutting process, an UV tape is applied onto the backside of the silicon wafer 70, and the silicon wafer 70 is fixed with the principal surface facing upward. Then, the silicon wafer and the mold resin part 74 together are cut by a diamond blade, which results in individualization and completion of the semiconductor devices 80.

Although the above-mentioned silicon wafer 70 has a circular shape and a plurality of semiconductor chips 71 are formed over the entire surface of the silicon wafer 70, the resin-molding may be performed by providing an opening in the center of the silicon wafer 70 so as to supply the resin from the backside of the silicon wafer as shown in FIG. 20.

Moreover, generation of a warp in the silicon wafer 70 can be further suppressed by providing through holes in the silicon wafer 70 as shown in FIG. 27 so as to form a resin part on the backside of the silicon wafer 70. The through holes are formed in an area where the resin-molding is performed and in an area other than the area where the semiconductor devices are formed.

The present invention is not limited to the specifically disclosed embodiments, and variations and modifications may be made without departing from the scope of the present invention.

The present application is based on Japanese priority application No. 2002-342964 filed Nov. 26, 2002, the entire contents of which are hereby incorporated by reference.

What is claimed is:

1. A mold method of a substrate sheet material, comprising:
    preparing a circular substrate sheet material in which a plurality of substrates are formed;
    mounting a semiconductor chip onto each of the substrates;
    resin-molding the semiconductor chips all at once; and
    wherein at least one opening is formed in said circular substrate sheet material and a mold resin is filled into a cavity of a mold die through said at least one opening.

2. The mold method as claimed in claim 1, wherein said opening is formed at a center of the circular substrate sheet.

3. The mold method as claimed in claim 1, further comprising:
    forming at least one through hole at said at least one opening outside an area where the substrate are formed and within an area where a resin mold is formed; and
    supplying a mold resin to a backside of the substrate sheet material opposite to a front side where the semiconductor chips are mounted so as to form a resin part on the backside.

4. The mold method as claimed in claim 3, comprising:
    forming a plurality of the through holes along a circumference of a resin part formed on the surface of the substrate sheet material;
    supplying the mold resin to the backside through the plurality of through holes; and
    forming on the backside a resin part having a shape along the resin part formed on the front side.

5. A mold method of a substrate sheet material comprising:
    preparing a substrate sheet material in which a plurality of substrates are formed, the substrate sheet material having at least one through hole outside an area where the substrates are formed and within an area where a resin mold is formed;
    mounting a semiconductor chip onto each of the substrate of the substrate sheet material;
    molding the mounted semiconductor chips all at once; and
    introducing a mold resin through the through hole into a backside of the substrate sheet material opposite to a front side on which the semiconductor chips are mounted so as to form a resin part on the backside.

6. The mold method as claimed in claim 5, comprising:
    forming a plurality of the through holes along a circumference of the resin part formed on the front side of the substrate sheet material;
    supplying the mold resin to the backside through the plurality of through holes; and
    forming on the backside of the substrate sheet material a resin part having a shape along the resin part formed on the front side of the substrate sheet material.

7. A manufacturing method of a substrate sheet material for manufacturing substrates all at once, the substrates used for manufacturing semiconductor packages, the method comprising:
    preparing a sheet material having a circular outer configuration; and
    forming a circular substrate sheet material by forming wiring on the sheet material and forming a plurality of substrates in the sheet material and
    wherein at least one opening is formed in said circular substrate sheet material and a mold resin is filled into a cavity of a mold die through said at least one opening.

8. A manufacturing method of a substrate sheet material for manufacturing substrates all at once, the substrates used for manufacturing semiconductor packages, the method comprising:
    preparing a sheet material having a quadrate outer configuration;
    forming wiring on the sheet material and forming a plurality of substrates in the sheet material; and
    forming a circular substrate sheet material by cutting the sheet material having the plurality of substrates in a circular shape.

9. A manufacturing method of semiconductor devices, comprising:
    preparing a circular substrate sheet material in which a plurality of substrates are formed, the substrates used for producing semiconductor packages;
    mounting a semiconductor chips onto each of the substrates of the circular substrate sheet material;
    molding the semiconductor chips on the substrate sheet material all at once so as to form the semiconductor packages corresponding to the respective substrates;
    individualizing the semiconductor packages; and wherein at least one opening is formed in said circular substrate sheet material and a mold resin is filled into a cavity of a mold die through said at least one opening.

10. The manufacturing method of semiconductor devices as claimed in claim 9, wherein said opening is a through opening part formed at a center of the substrate material.

11. The manufacturing method of semiconductor devices as claimed in claim 9, wherein said opening is a at least one through hole formed outside an area where the substrates are formed and within an area where a resin mold is formed.

12. The manufacturing method of semiconductor devices as claimed in claim 11, wherein a plurality of the through holes are formed along a circumference of the area where the substrates are formed.

13. A manufacturing method of semiconductor devices, comprising:

preparing a substrate sheet material in which a plurality of substrates used for producing the semiconductor devices are formed and at least one through hole is provided in an area other than an area where the substrates are formed;

mounting a semiconductor chip onto each of the substrates off the substrate sheet material;

resin-molding the mounted semiconductor chips all at once;

introducing a mold resin through the through hole into a backside of the substrate sheet material opposite to a front side on which the semiconductor chips are mounted so as to form a resin part on the backside;

forming semiconductor packages corresponding to the respective substrates; and individualizing the semiconductor packages.

14. The manufacturing method of semiconductor devices as claimed in claim 13, comprising:

forming a plurality of the through holes along a circumference of the resin part formed on the front side of the substrate sheet material;

supplying the mold resin to the backside of the substrate sheet material through the plurality of through holes; and forming on the backside of the substrate sheet material a resin part having a shape along a circumference of the resin part formed on the front side.

15. A manufacturing method of semiconductor devices, comprising:

preparing a circular semiconductor manufacturing material having a principal surface on which a plurality of electronic parts are formed;

immersing the semiconductor manufacturing material into a dissolved resin;

curing the dissolved resin; and cutting the semiconductor manufacturing material and the resin part on the principal surface together so as to separate into a plurality of resin coated chip-like electronic parts;

wherein only said principal surface is immersed in said dissolved resin.

* * * * *